(12) United States Patent
Shima

(10) Patent No.: US 11,804,471 B2
(45) Date of Patent: Oct. 31, 2023

(54) METHOD FOR MANUFACTURING SEMICONDUCTOR DEVICE AND SEMICONDUCTOR MANUFACTURING APPARATUS

(71) Applicant: Kioxia Corporation, Tokyo (JP)

(72) Inventor: Masaya Shima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 235 days.

(21) Appl. No.: 17/188,354

(22) Filed: Mar. 1, 2021

(65) Prior Publication Data

US 2022/0084985 A1 Mar. 17, 2022

(30) Foreign Application Priority Data

Sep. 14, 2020 (JP) ................................. 2020-154079

(51) Int. Cl.
*H01L 21/68* (2006.01)
*H01L 21/56* (2006.01)
(Continued)

(52) U.S. Cl.
CPC ........ *H01L 25/0657* (2013.01); *H01L 21/561* (2013.01); *H01L 21/565* (2013.01); *H01L 21/568* (2013.01); *H01L 21/67092* (2013.01); *H01L 21/68* (2013.01); *H01L 21/6836* (2013.01); *H01L 21/78* (2013.01); *H01L 25/50* (2013.01); *H01L 2221/68336* (2013.01); *H01L 2221/68368* (2013.01);
(Continued)

(58) Field of Classification Search
None
See application file for complete search history.

(56) References Cited

U.S. PATENT DOCUMENTS 8,394,678 B2 3/2013 Murayama
8,399,974 B1 * 3/2013 Huneke ............... H01L 25/0657
257/E23.085

(Continued)

FOREIGN PATENT DOCUMENTS

JP 2011-029581 A 2/2011
JP 2014-107339 A 6/2014
(Continued)

*Primary Examiner* — Jay C Chang
(74) *Attorney, Agent, or Firm* — Foley & Lardner LLP

(57) ABSTRACT

A method for manufacturing a semiconductor device is provided. The manufacturing method includes attaching a substrate to a sheet. The manufacturing method includes fragmenting the substrate into a plurality of individual chips. The manufacturing method includes expanding the sheet to widen the spacing between the plurality of chips. The manufacturing method includes covering the main surface and side surface of each of the plurality of chips with resin and sealing the chips to form a sealed body. The manufacturing method includes forming a stacked body in which a plurality of sealed bodies are stacked. The plurality of sealed bodies include a first sealed body and a second sealed body. Forming the stacked body includes stacking the second sealed body on the first sealed body in a state where the position of the chip in the second sealed body is offset in a direction in the plane with respect to the position of the chip in the first sealed body.

14 Claims, 21 Drawing Sheets

(51) Int. Cl.
    *H01L 21/78*     (2006.01)
    *H01L 21/683*     (2006.01)
    *H01L 21/67*     (2006.01)
    *H01L 25/065*     (2023.01)
    *H01L 25/00*     (2006.01)

(52) U.S. Cl.
    CPC ............ *H01L 2225/0651* (2013.01); *H01L 2225/06548* (2013.01); *H01L 2225/06562* (2013.01); *H01L 2225/06586* (2013.01)

(56) References Cited

U.S. PATENT DOCUMENTS

| | | |
|---|---|---|
| 10,490,531 B2 | 11/2019 | Kurosawa |
| 2012/0077314 A1 | 3/2012 | Park |
| 2012/0223441 A1* | 9/2012 | Omizo ............... H01L 25/0657 257/E23.141 |

FOREIGN PATENT DOCUMENTS

| | | |
|---|---|---|
| JP | 2018-067667 A | 4/2018 |
| JP | 2018-067678 A | 4/2018 |
| JP | 2019-057575 A | 4/2019 |

* cited by examiner

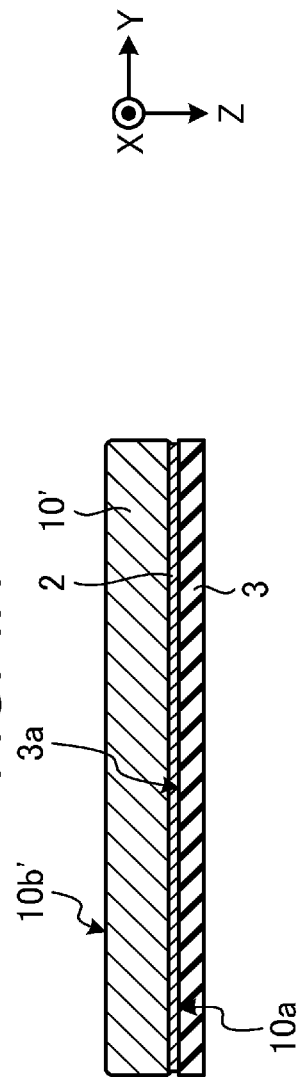
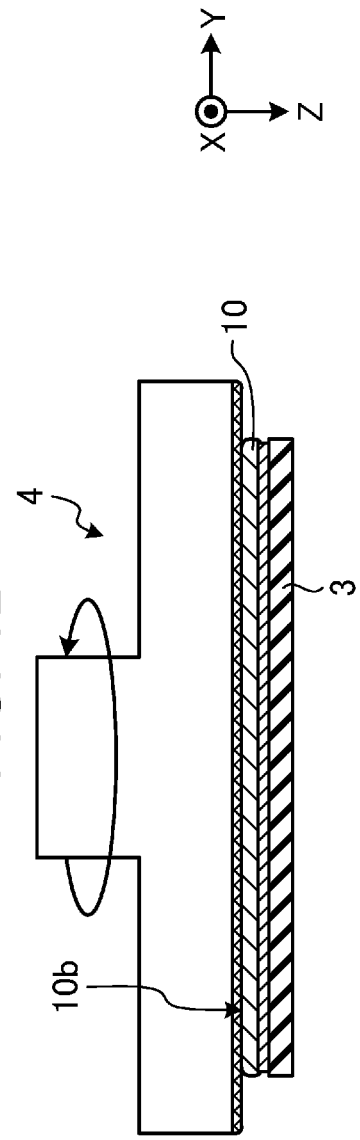
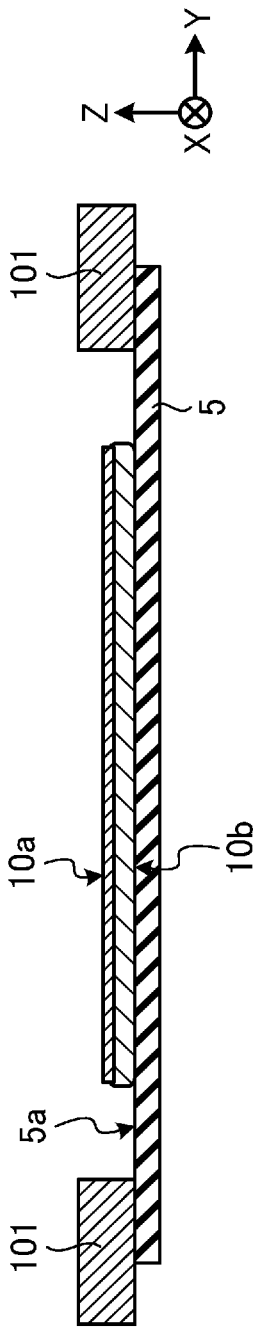

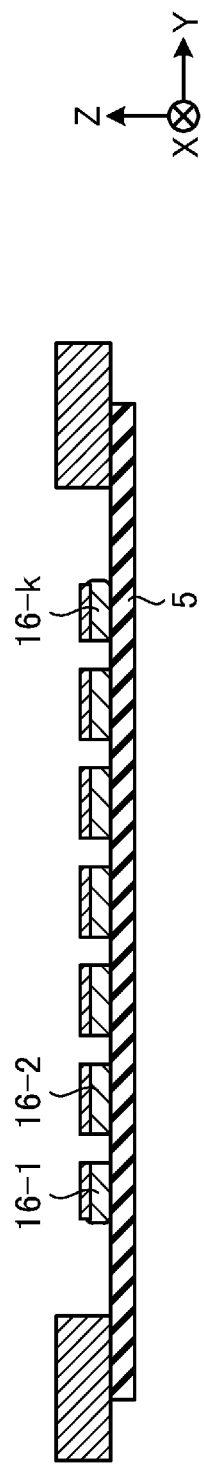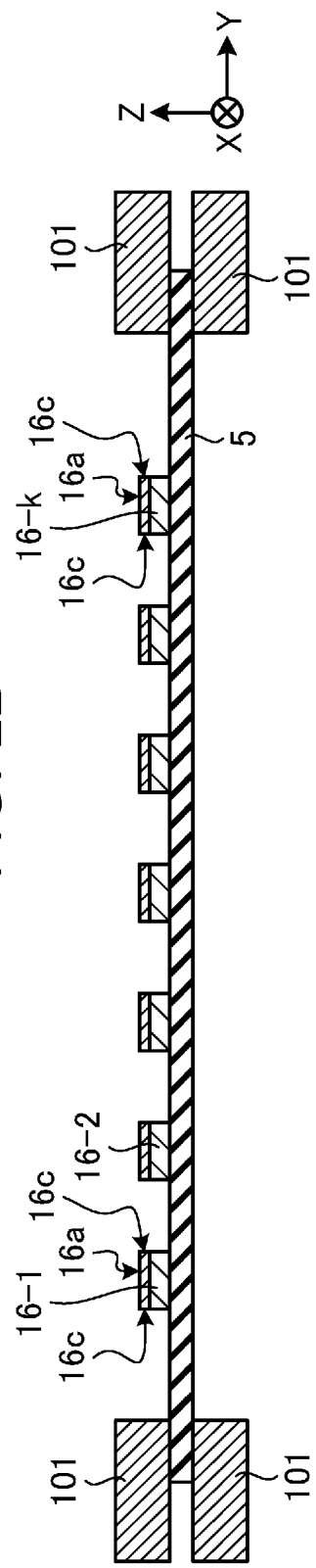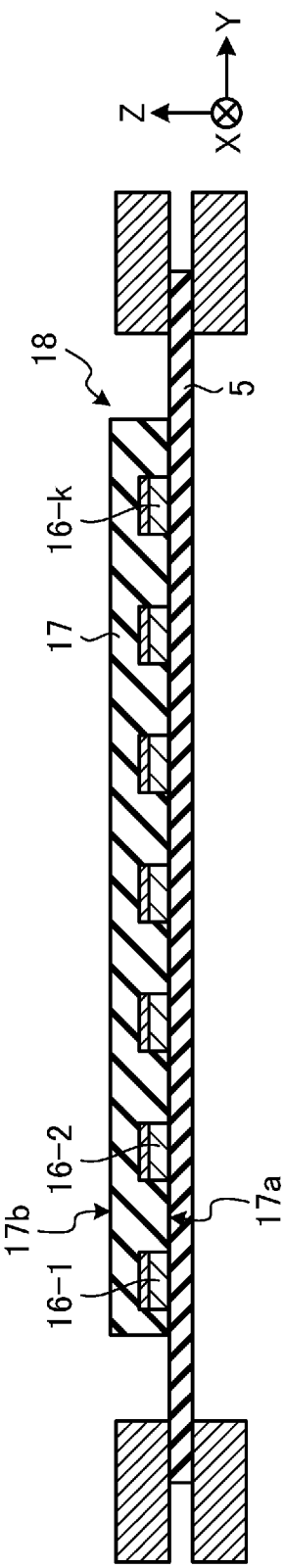

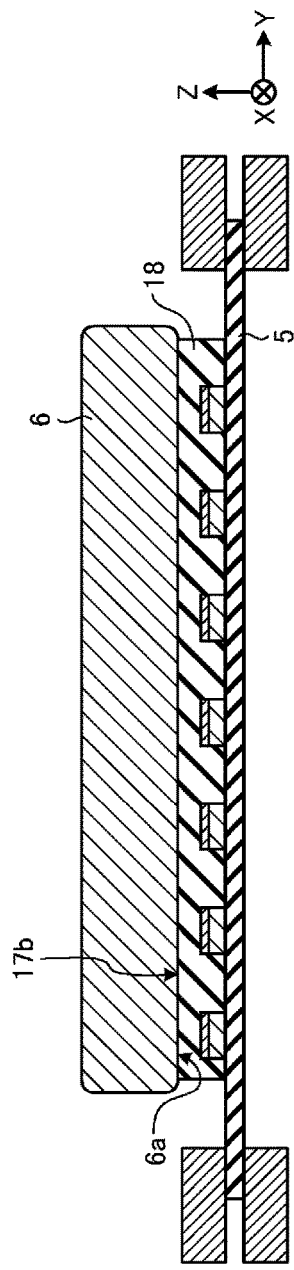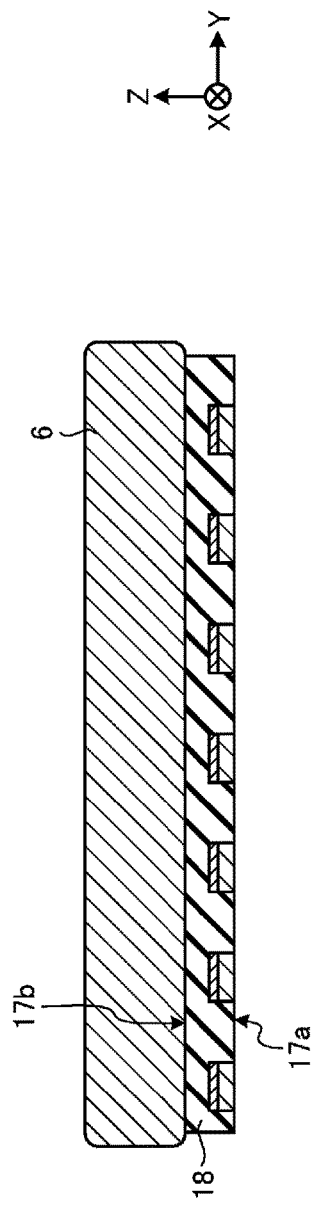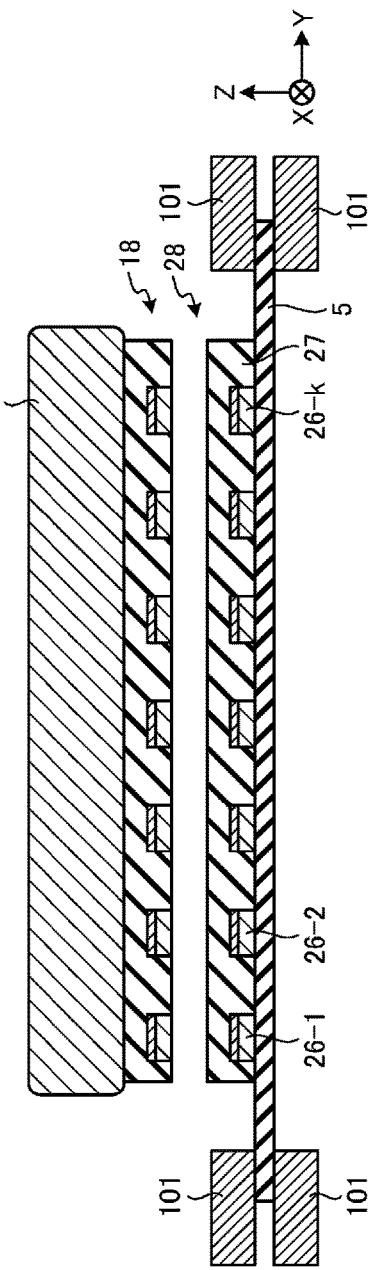

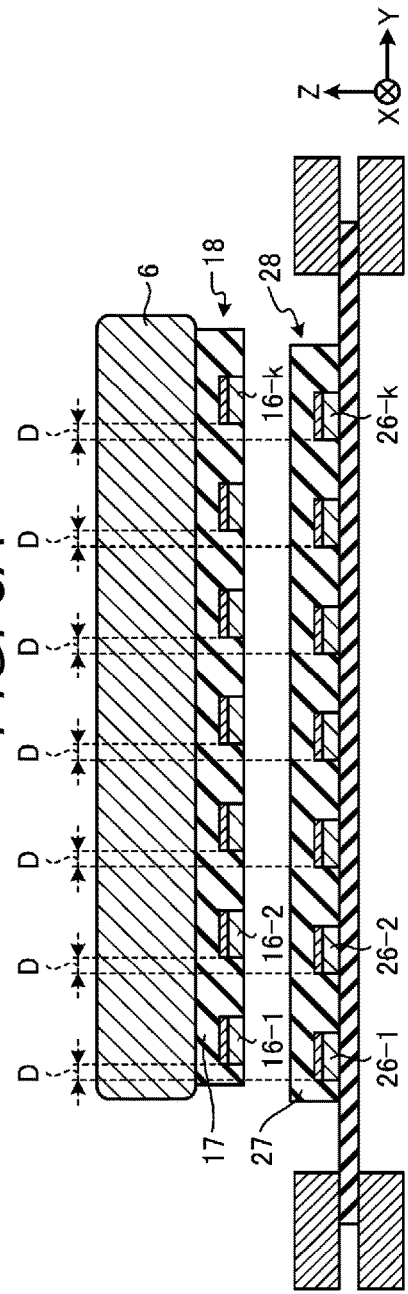
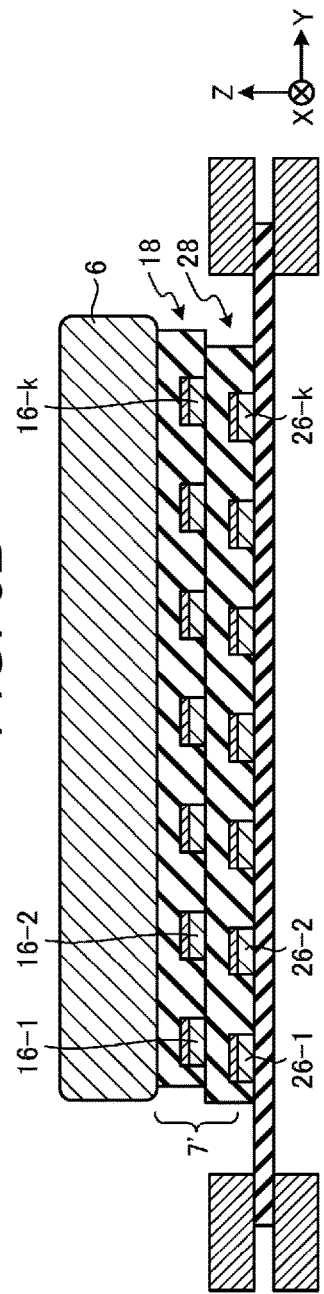
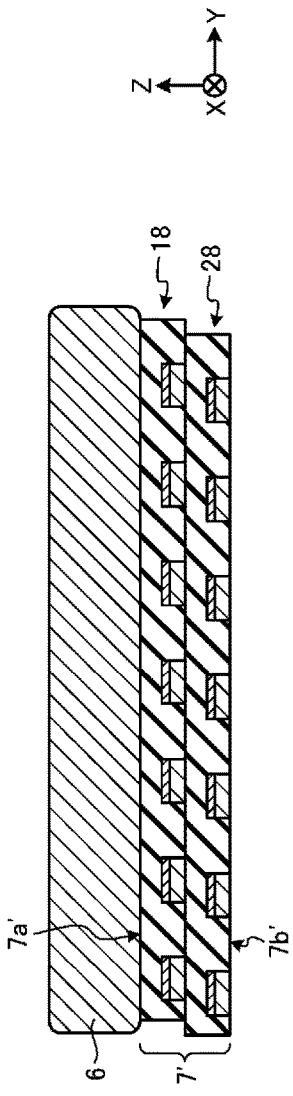

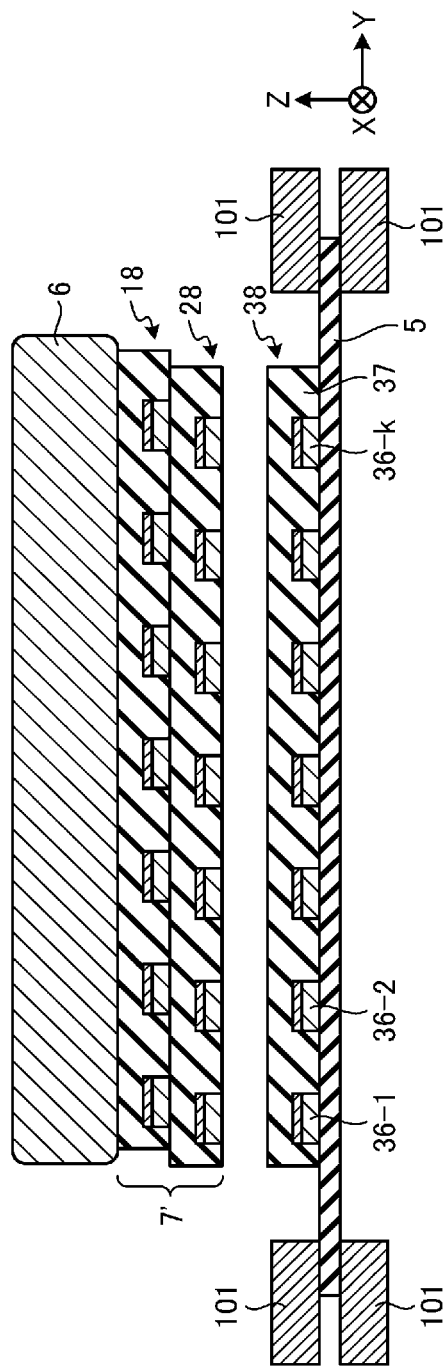
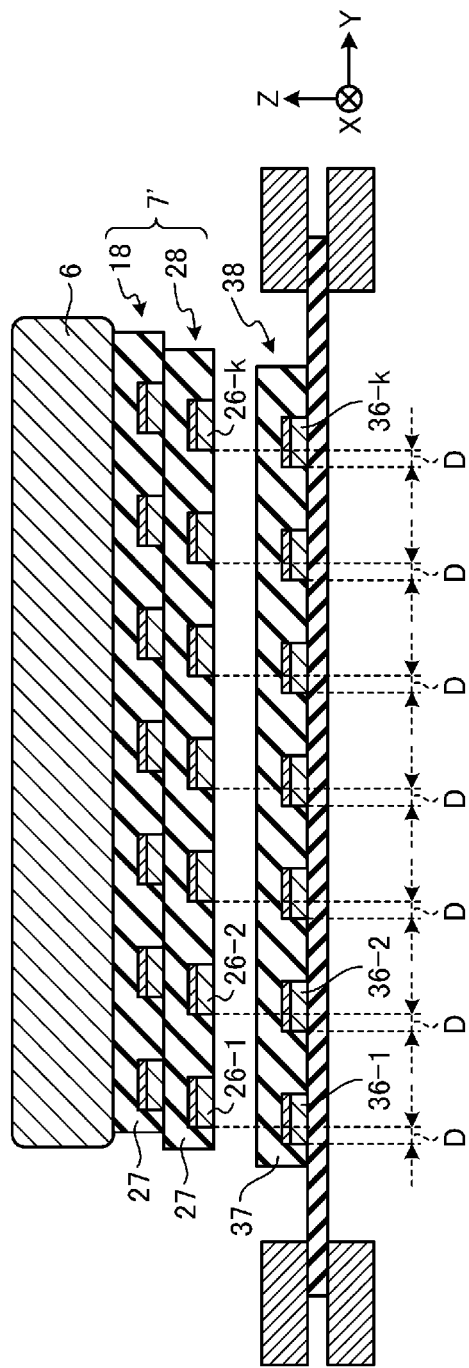

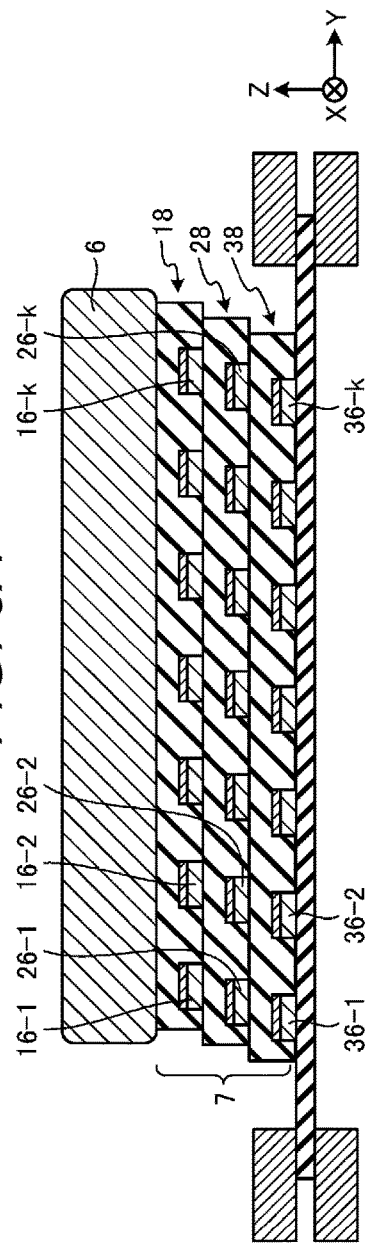
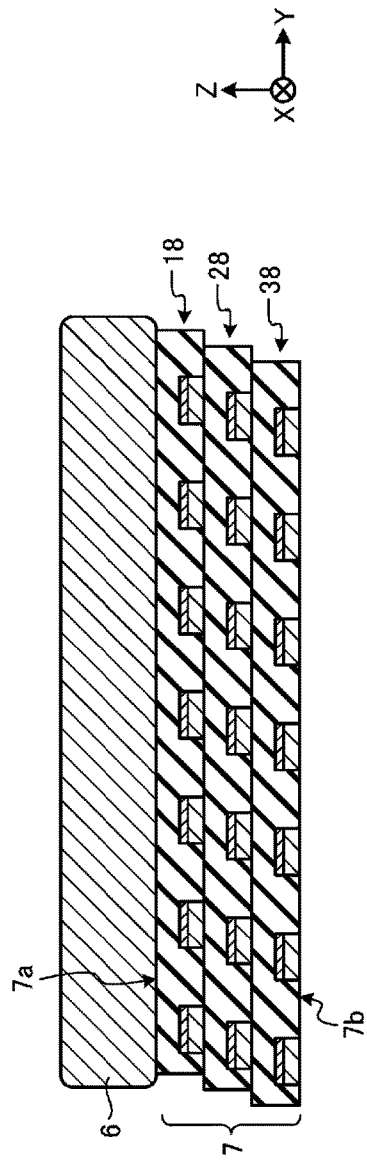
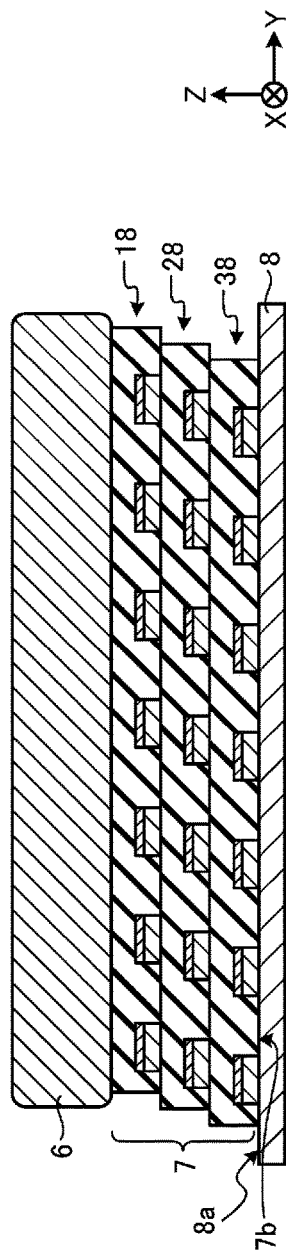

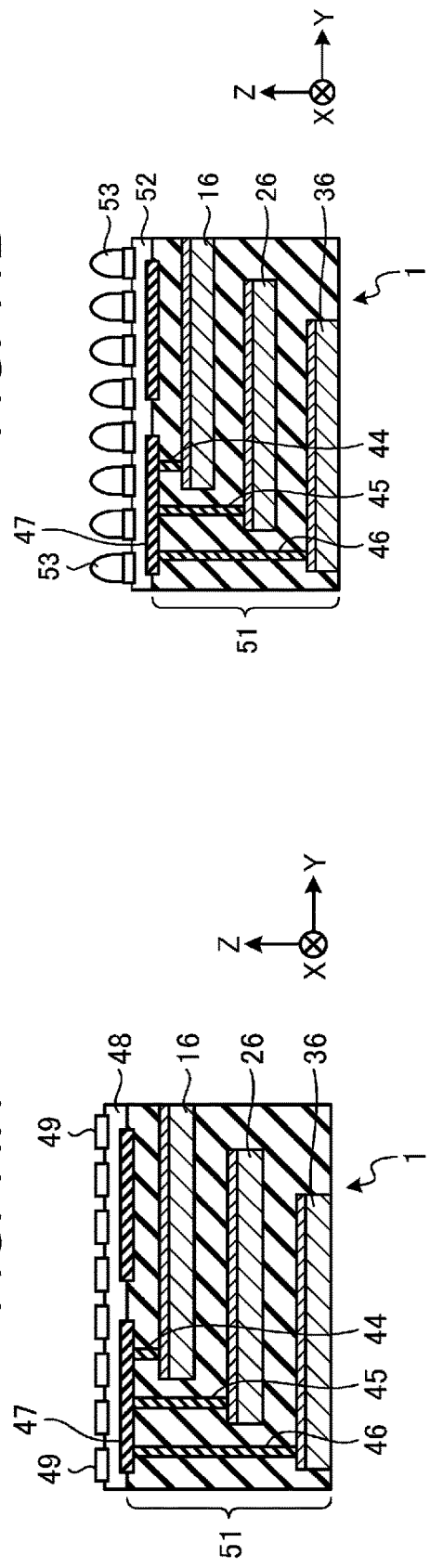

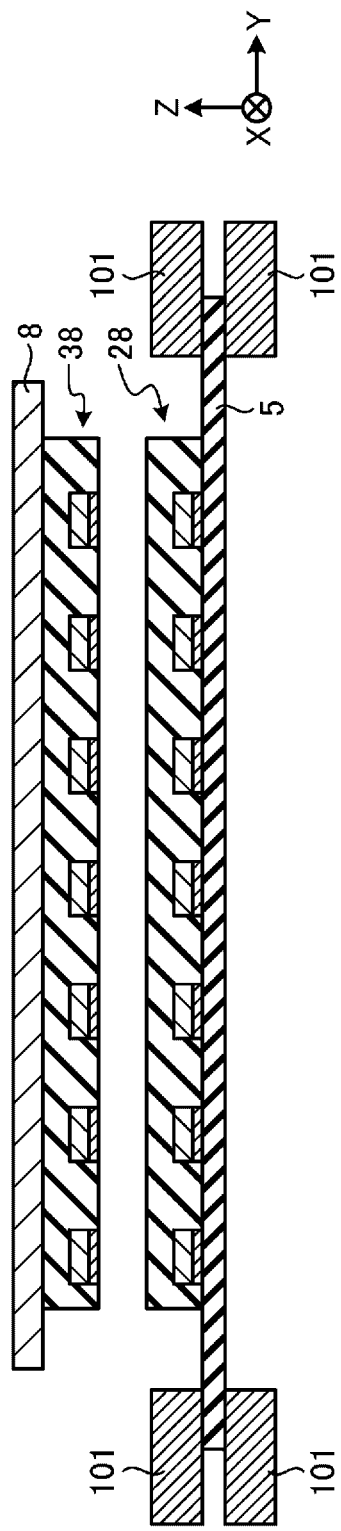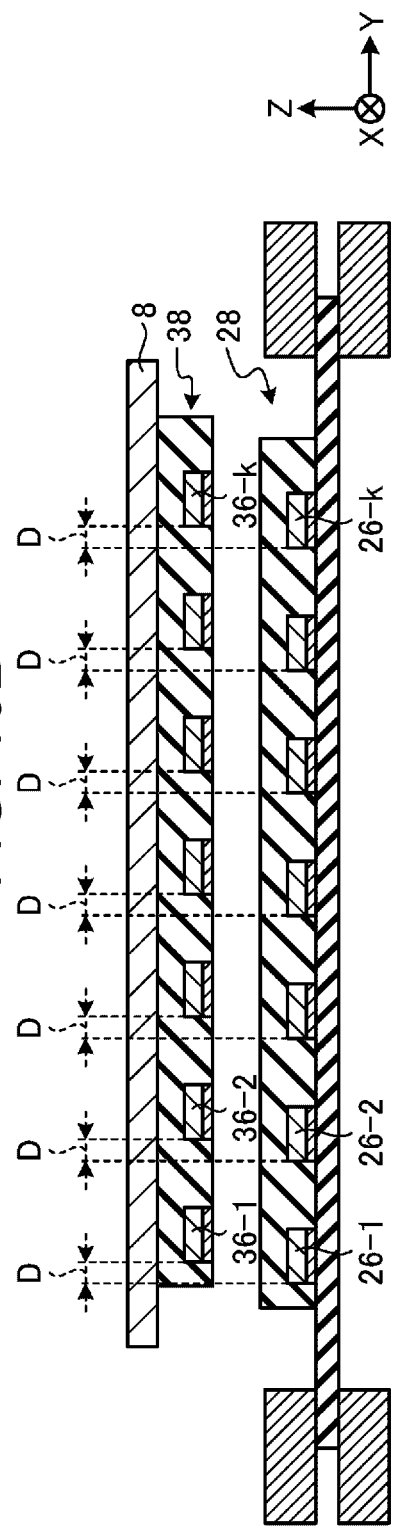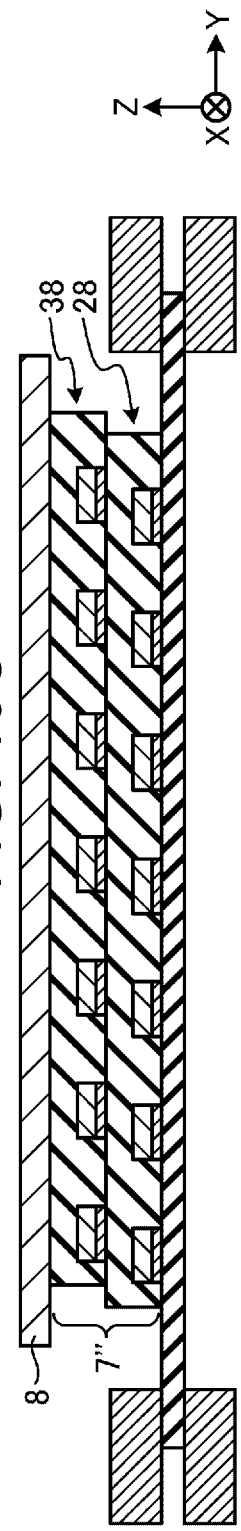

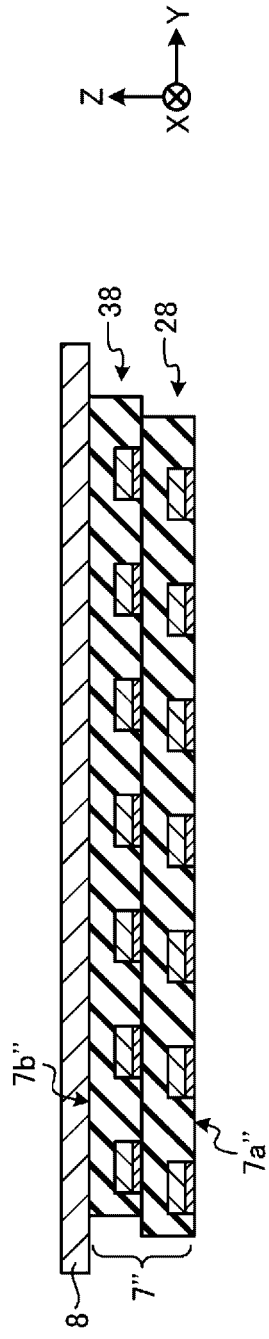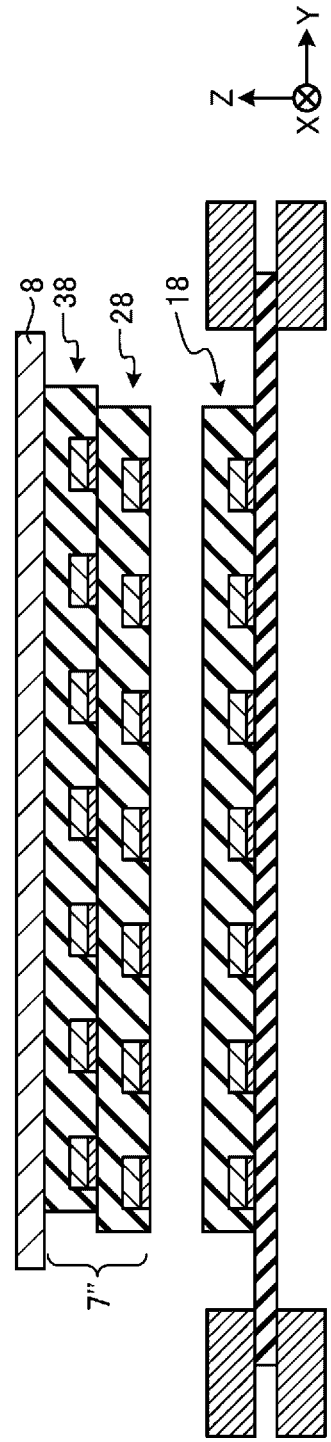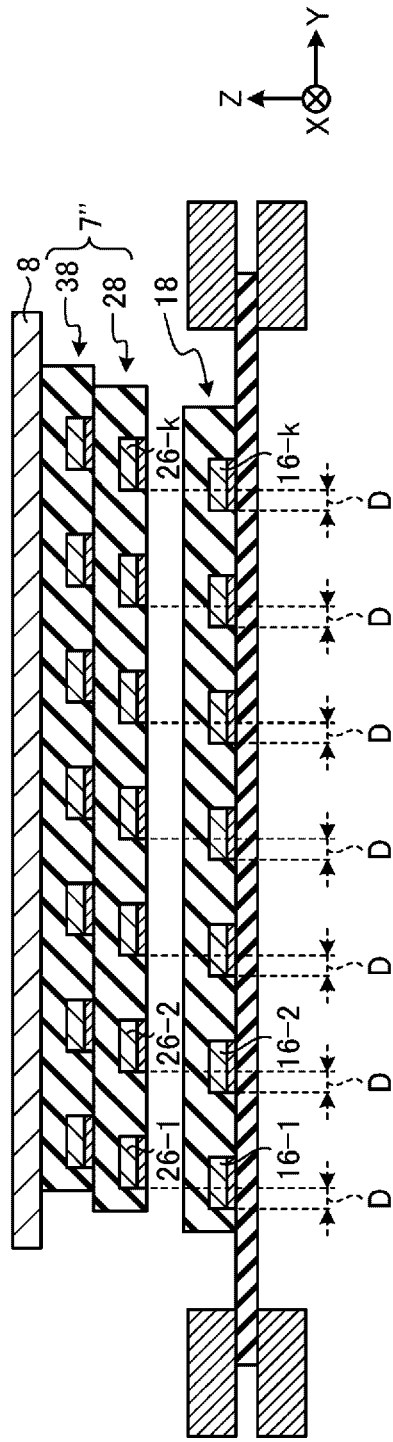

METHOD FOR MANUFACTURING SEMICONDUCTOR DEVICE AND SEMICONDUCTOR MANUFACTURING APPARATUS

CROSS-REFERENCE TO RELATED APPLICATION

This application is based upon and claims the benefit of priority from Japanese Patent Application No. 2020-154079, filed on Sep. 14, 2020, the entire contents of which are incorporated herein by reference.

FIELD

Embodiments described herein relate generally to a method for manufacturing a semiconductor device and a semiconductor manufacturing apparatus.

BACKGROUND

In the process of manufacturing a semiconductor device by attaching a substrate to a sheet, fragmenting the substrate into a plurality of individual chips, and sealing the chips after the fragmentation, it has been desired to improve the throughput.

DESCRIPTION OF THE DRAWINGS

FIGS. 1A to 1C are cross-sectional views showing a method for manufacturing a semiconductor device according to at least one embodiment;

FIGS. 2A to 2C are cross-sectional views showing the method for manufacturing a semiconductor device;

FIGS. 4A to 4C are cross-sectional views showing the method for manufacturing a semiconductor device;

FIGS. 5A to 5C are cross-sectional views showing the method for manufacturing a semiconductor device;

FIGS. 7A and 7B are cross-sectional views showing the method for manufacturing a semiconductor device;

FIGS. 8A to 8C are cross-sectional views showing the method for manufacturing a semiconductor device;

FIGS. 11A to 11C are cross-sectional views showing the method for manufacturing a semiconductor device;

FIGS. 19A to 19C are cross-sectional views showing the method for manufacturing a semiconductor device;

FIGS. 20A to 20C are cross-sectional views showing the method for manufacturing a semiconductor device.

DETAILED DESCRIPTION

Figure 3A:
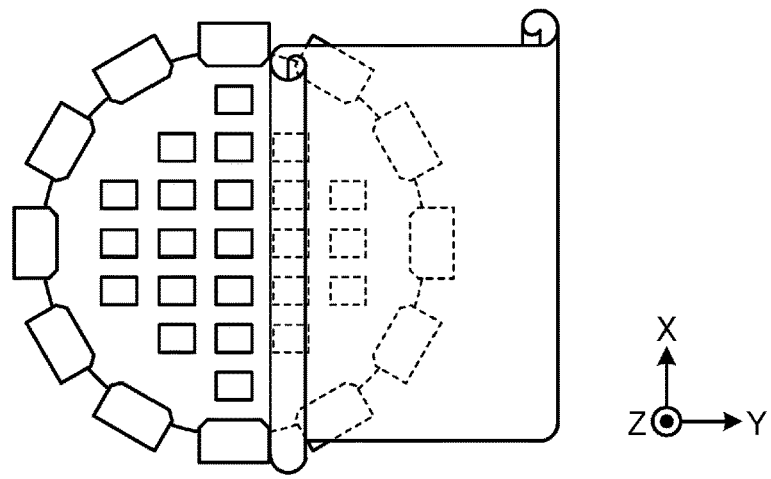
FIGS. 3A to 3C are plan views showing the method for manufacturing a semiconductor device.

At least one embodiment provides a method for manufacturing a semiconductor device and a semiconductor manufacturing apparatus, capable of improving the throughput.

In general, according to at least one embodiment, a method for manufacturing a semiconductor device is provided. The manufacturing method includes attaching a substrate to a sheet. The manufacturing method includes fragmenting the substrate into a plurality of individual chips. The manufacturing method includes expanding the sheet to widen the spacing between the plurality of chips. The manufacturing method includes covering the main surface and side surface of each of the plurality of chips with resin and sealing the chips to form a sealed body. The manufacturing method includes forming a stacked body in which a plurality of sealed bodies are stacked. The plurality of sealed bodies include a first sealed body and a second sealed body. Forming the stacked body includes stacking the second sealed body on the first sealed body in a state where the position of the chip in the second sealed body is offset in a direction in the plane with respect to the position of the chip in the first sealed body.

The manufacturing method of a semiconductor device according to at least one embodiment will be described in detail with reference to the accompanying drawings below. It is noted that the present disclosure is not limited to the embodiments described.

Embodiment

A method for manufacturing a semiconductor device according to at least one embodiment will be described.

A semiconductor device can be manufactured as shown in FIGS. 1A to 10B. FIGS. 1A to 2C, 4A to 5C, and 7A to 11C are cross-sectional views showing the method for manufacturing a semiconductor device. FIGS. 3A to 3C and 6 are plan views showing the method for manufacturing a semiconductor device. In the following, the direction perpendicular to the surface of the semiconductor substrate is defined as the Z direction, and the two directions orthogonal to each other in the plane perpendicular to the Z direction are defined as the X direction and the Y direction.

In the process of FIG. 1A, a semiconductor substrate 10' is prepared. The semiconductor substrate 10' has a front surface 10a on the +Z side and a back surface 10b' on the −Z side. A plurality of chip regions are patterned on the front surface 10a' of the semiconductor substrate 10' by a predetermined process to form a device layer 2. The pattern of each of the chip regions is a rectangular pattern and includes a plurality of external connection terminals (see FIG. 6) arranged along one side of the rectangle. Then, the front surface 10a' of the semiconductor substrate 10' on which the device layer 2 has been formed is attached to a sheet 3. Here, the semiconductor substrate 10' is attached to the sheet 3 with the back surface 10b' exposed (face-down state). The sheet 3 is a back grind tape or the like and has an adhesive formed on the surface 3a thereof. The sheet 3 is made of, for example, transparent resin having light transmittance.

In the process of FIG. 1B, the back surface 10b' of the semiconductor substrate 10' is polished and the semiconductor substrate 10 is thinned. When the polishing surface of a grinder 4 is brought into contact with the back surface 10b' of the semiconductor substrate 10' and the grinder 4 rotates, the back surface 10b' of the semiconductor substrate 10' can be polished. As a result, the semiconductor substrate 10 is thinned to a thickness that meets the demand for miniaturization of the package size. The back surface 10b of the semiconductor substrate 10 is polished and flattened.

In the process of FIG. 1C, the semiconductor substrate 10 is transferred from the sheet 3 to the sheet 5. The sheet 5 is a dicing tape or the like and has an adhesive formed on the surface 5a thereof. The sheet 5 is stretched inside a holding member 101 and held by the holding member 101. The sheet 5 is made of, for example, transparent resin having light transmittance. The back surface 10b of the semiconductor substrate 10 is attached to the sheet 5. Here, the semiconductor substrate 10 is attached to the sheet 5 with the front surface 10a exposed (face-up state).

In the process of FIG. 2A, the semiconductor substrate 10 is fragmented to k chips 16-1 to 16-k. k is an integer of 3 or more. For example, the semiconductor substrate 10 is diced along the dicing line. The dicing process may be performed by cutting with a dicing blade along the dicing line. Alternatively, the dicing process may be performed by performing the laser process of irradiating with a laser along the dicing line. Each of the chips 16-1 to 16-k is a semiconductor chip. On the sheet 5, k chips 16-1 to 16-k are arranged in a matrix configuration in the XY directions.

In the process of FIG. 2B, the sheet 5 is expanded to widen the spacing between the plurality of chips 16-1 to 16-k on the sheet 5. For example, the positions of the chips 16-1 to 16-k on the sheet 5 are measured while being held by the holding member 101. According to the measurement result, the sheet 5 is expanded toward the periphery via the holding member 101 with the plurality of chips 16-1 to 16-k attached. On the sheet 5, k chips 16-1 to 16-k are arranged in a matrix configuration while being separated in the XY directions.

In the process of FIG. 2C, the front surface 16a and side surface 16c of each of the plurality of chips 16-1 to 16-k are covered with an insulating film 17 to form a sealed body 18. The insulating film 17 is thermosetting or photocurable organic resin in an uncured or semi-cured state. The insulating film has, for example, the insulating property and light transmittance. The insulating film 17 has a thickness capable of covering the front surface and side surface of each of the chips 16-1 to 16-k, and is, for example, about twice as thick as the thickness of each of the chips 16-1 to 16-k.

Figure 3B:
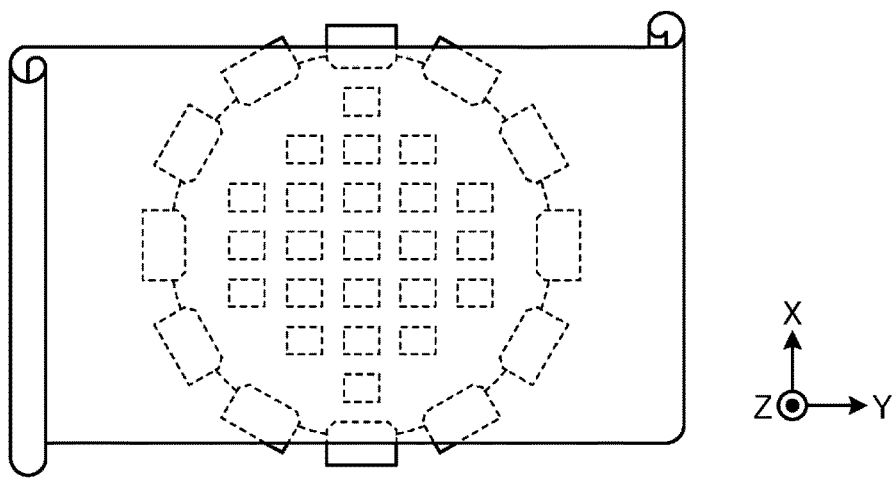
Figure 3C:
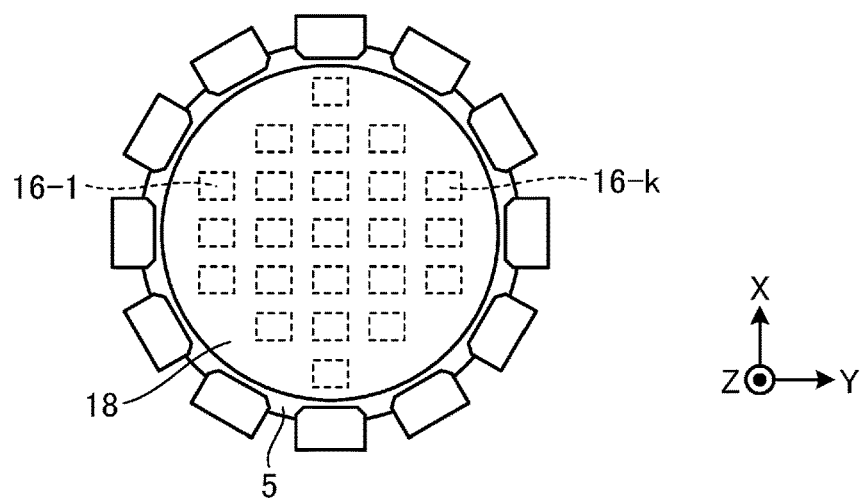

For example, as shown in FIG. 3A, the insulating film 17 covers the plurality of chips 16-1 to 16-k (see FIG. 2B) from the front surface 17a side thereof. As shown in FIG. 3B, the insulating film 17 is pressed with predetermined stress in the −Z direction. As a result, as shown in FIG. 2C, the insulating film 17 is attached to cover the front surface 16a and the side surface 16c of each of the plurality of chips 16-1 to 16-k. Then, as shown in FIG. 3C, the insulating film 17 is cut out into a shape corresponding to the semiconductor substrate 10. As a result, the sealed body 18 is formed in which the front surface 16a and the side surface 16c of each of the chips 16-1 to 16-k are covered with the insulating film 17. The sealed body 18 is, for example, a disk-shaped member flat in the XY direction. In the sealed body 18, k chips 16-1 to 16-k are arranged in a matrix configuration while being separated in the XY directions.

In the process of FIG. 4A, a support 6 is attached to the back surface 17b of the sealed body 18. The support 6 is attached to the support 6 with the adhesive formed on the surface 6a or is attached by the adhesiveness of the uncured insulating film 17. The support 6 only needs to be able to support the sealed body 18 and is not required to have rigidity, and thus, the support 6 may be made of any material having light transmittance. The support 6 has a shape corresponding to the sealed body 18, for example, a disk shape flat in the XY direction.

In the process of FIG. 4B, the sealed body 18 is transferred from the sheet 5 to the support 6. In the sealed body 18, the sheet 5 is peeled off from the front surface 17a to expose the front surface 17a while maintaining the state in which the back surface 17b is supported by the support 6. As a result, the first-stage sealed body 18 can be obtained in which the back surface 17b is supported by the support 6 and the front surface 17a is exposed.

In the process of FIG. 4C, a second-stage sealed body 28 is prepared. The second-stage sealed body 28 is prepared in the same manner as in FIGS. 1A to 3C. The second-stage sealed body 28 is in a state of being attached to the sheet 5. The first-stage sealed body 18 is disposed on the +Z side of the second-stage sealed body 28 by grasping and moving the support 6. Alternatively, the second-stage sealed body 28 is disposed on the −Z side of the first-stage sealed body 18 by moving the sheet 5 with the holding member 101, or the like.

Figure 6:
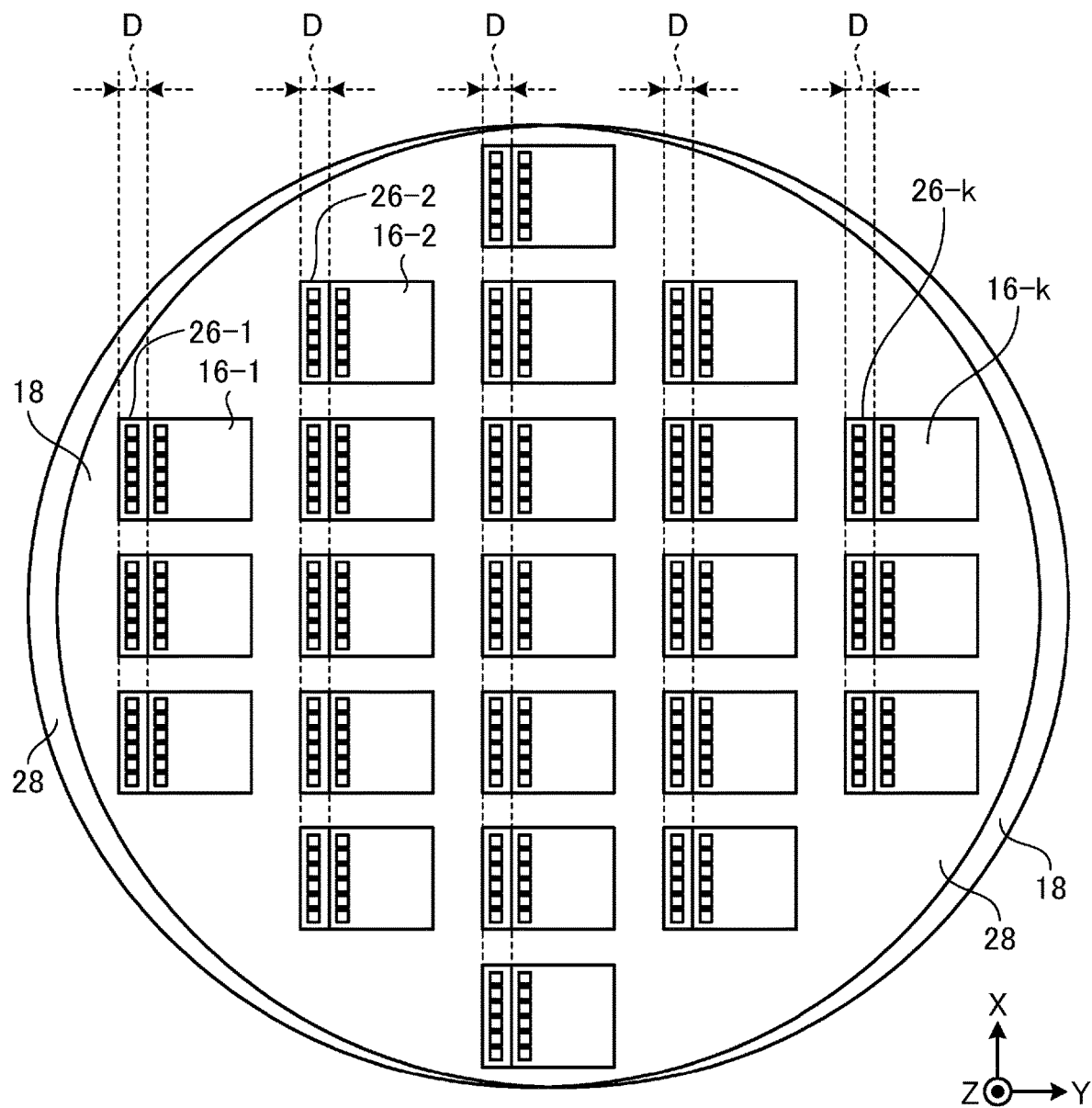
FIG. 6 is a plan view showing the method for manufacturing a semiconductor device.

In the process of FIG. 5A, the Y position of each of the chips 16-1 to 16-k in the first-stage sealed body 18 is offset by an offset amount D with respect to the Y position of each of the chips 26-1 to 26-k in the second-stage sealed body 28. Since the support 6 and the insulating films 17 and 27 have light transmittance, the positions of the chips 16-1 to 16-k and 26-1 to 26-k can be checked from the +Z side of the support 6. As shown in FIG. 6, the offset amount D is smaller than the spacing between the chips 26 in the sealed body 28 in the Y direction and larger than the dimension of the pad in the chip 26 in the Y direction. Although the X positions of the chips 16-1 to 16-k and the X positions of the chips 26-1 to 26-k are equal to each other, the X position may be offset in a similar manner to the Y position.

In the process of FIG. 5B, the first-stage sealed body 18 is stacked on the second-stage sealed body 28. As a result, a stacked body 7' is formed in which the plurality of sealed bodies 18 and 28 are stacked while the chip positions of the plurality of sealed bodies 18 and 28 are offset from each other in the plane direction.

In the stacked body 7', the plurality of chips 16-1 to 16-k in the sealed body 18 and the plurality of chips 26-1 to 26-k in the sealed body 28 correspond to each other. In the stacked body 7', each of the chips 16-1 to 16-k is disposed apart from the corresponding chip 26 on the +Z side and is electrically insulated from the corresponding chip 26. The Y position of each of the chips 16-1 to 16-k is offset by the offset amount D in the +Y direction with respect to the Y position of the corresponding chip 26. The X position of each of the chips 16-1 to 16-k is equal to the X position of the corresponding chip 26.

In the process of FIG. 5C, the stacked body 7' is transferred from the sheet 5 to the support 6. In the stacked body 7', the sheet 5 is peeled off from the back surface 7b' to expose the back surface 7b' while maintaining the state in which the front surface 7a' is supported by the support 6. As a result, the stacked body 7' can be obtained in which the front surface 7a' is supported by the support 6 and the back surface 7b' is exposed.

In the process of FIG. 7A, a third-stage sealed body 38 is prepared. The third-stage sealed body 38 is prepared in the same manner as in FIGS. 1A to 3C. The third-stage sealed body 38 is in a state of being attached to the sheet 5. The stacked body 7' is disposed on the +Z side of the third-stage sealed body 38 by grasping and moving the support 6. Alternatively, the third-stage sealed body 38 is disposed on the −Z side of the stacked body 7' by moving the sheet 5 with the holding member 101, or the like.

In the process of FIG. 7B, the Y position of each of the chips 26-1 to 26-$k$ in the second-stage sealed body 28 is offset by the offset amount D with respect to the Y position of each of the chips 36-1 to 36-$k$ in the third-stage sealed body 38. Since the support 6 and the insulating films 17, 27, and 37 have light transmittance, the positions of the chips 26-1 to 26-$k$ and 36-1 to 36-$k$ can be checked from the +Z side of the support 6. The offset amount D is smaller than the spacing between the chips 36 in the sealed body 38 in the Y direction and larger than the dimension of the pad in the chip 36 in the Y direction (see FIGS. 5A to 5C). The X position of each of the chips 26-1 to 26-$k$ and the X position of each of the chips 36-1 to 36-$k$ may be equal to each other. The offset amount D in FIG. 7B may be equal to the offset amount D in FIGS. 5A and 6.

In the process of FIG. 8A, the stacked body 7' is stacked on the +Z side of the third-stage sealed body 38. As a result, a stacked body 7 is formed in which the plurality of sealed bodies 18, 28, and 38 are stacked while the chip positions of the plurality of sealed bodies 18, 28, and 38 are offset from each other in the XY plane direction.

In the stacked body 7, the plurality of chips 16-1 to 16-$k$ in the sealed body 18, the plurality of chips 26-1 to 26-$k$ in the sealed body 28, and the plurality of chips 36-1 to 36-$k$ in the sealed body 38 correspond to each other. In the stacked body 7, each of the chips 16-1 to 16-$k$ is disposed apart from the corresponding chip 26 on the +Z side and is electrically insulated from the corresponding chip 26. Each of the chips 26-1 to 26-$k$ is disposed apart from the corresponding chip 36 on the +Z side and is electrically insulated from the corresponding chip 36. The Y position of each of the chips 16-1 to 16-$k$ is offset by the offset amount D in the +Y direction with respect to the Y position of the corresponding chip 26. The Y position of each of the chips 26-1 to 26-$k$ is offset by the offset amount D in the +Y direction with respect to the Y position of the corresponding chip 36. The X position of each of the chips 16-1 to 16-$k$ is equal to the X position of the corresponding chip 26 and is equal to the X position of the corresponding chip 36. When viewed from the Z direction, a group of chips including the chips 16, 26, and 36 arranged in the Z direction are arranged in a matrix configuration while being separated from each other in the X and Y directions (see FIG. 6).

In the process of FIG. 8B, the stacked body 7 is transferred from the sheet 5 to the support 6. In the stacked body 7, the sheet 5 is peeled off from the back surface 7b to expose the back surface 7b while maintaining the state in which the front surface 7a is supported by the support 6. As a result, the stacked body 7 can be obtained in which the front surface 7a is supported by the support 6, and the back surface 7b is exposed.

In the process of FIG. 8C, a support 8 is attached to the back surface 7b of the stacked body 7. The support 8 has an adhesive formed on the front surface 8a thereof. The support 8 may be made of a material (glass, silicon, or the like) having a higher rigidity than the support 6 and having light transmittance and rigidity. The support 8 has a shape corresponding to the stacked body 7 and has, for example, a disk shape flat in the XY directions.

Figure 9A:
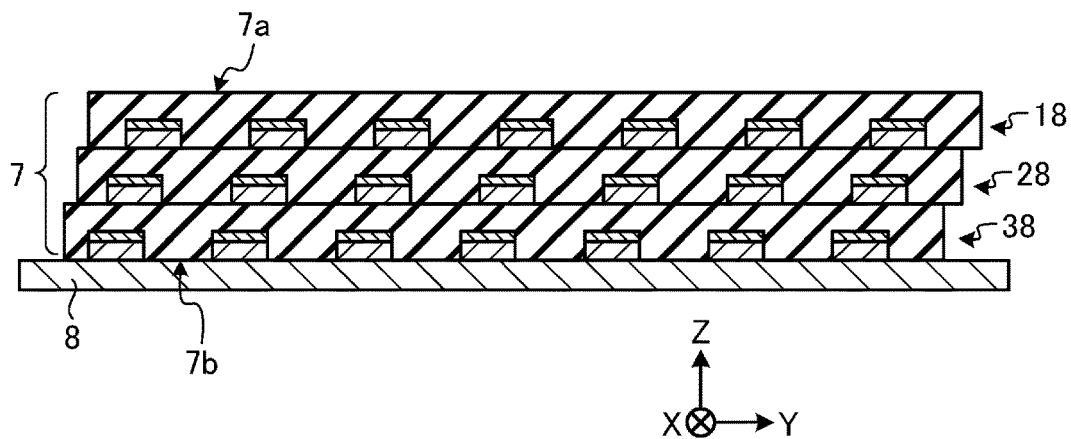
FIGS. 9A to 9C are cross-sectional views showing the method for manufacturing a semiconductor device.

In the process of FIG. 9A, the stacked body 7 is transferred from the support 6 to the support 8. In the stacked body 7, the support 6 may be peeled off from the front surface 7a to expose the front surface 7a while maintaining the state in which the back surface 7b is supported by the support 8. As a result, the stacked body 7 can be obtained in which the back surface 7b is supported by the support 8 and the front surface 7a is exposed.

Figure 9B:
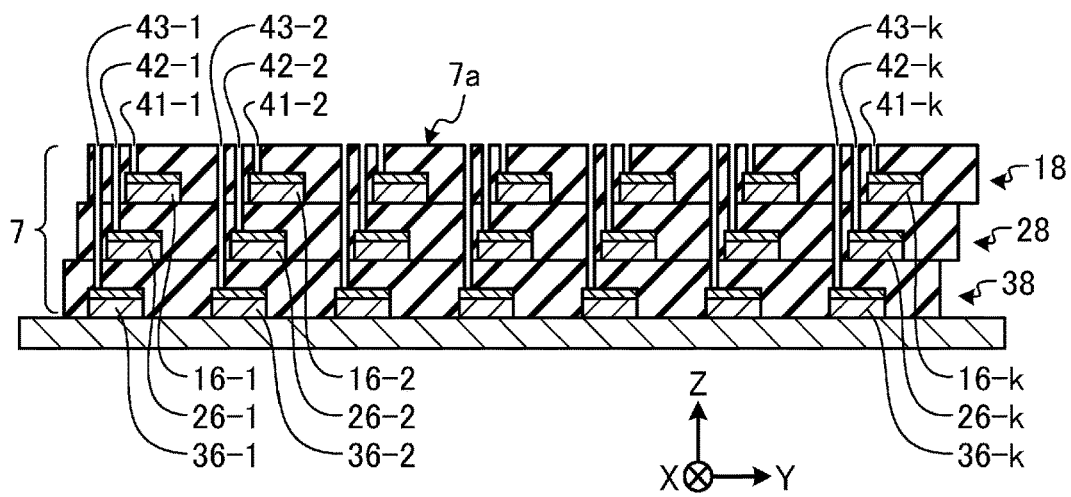

In the process of FIG. 9B, via-holes 41, 42, and 43 are formed in the stacked body 7 by the laser process or the like. The via-holes 41, 42, and 43 have different depths and the depths are gradually increased. The via-holes 41-1 to 41-$k$ reach from the front surface 7a of the stacked body 7 to the pads of the chips 16-1 to 16-$k$ of the sealed body 18, respectively to expose the pads. The via-holes 42-1 to 42-$k$ reach from the front surface 7a of the stacked body 7 to the pads of the chips 26-1 to 26-$k$ of the sealed body 28, respectively to expose the pads. The via-holes 43-1 to 43-$k$ reach from the front surface 7a of the stacked body 7 to the pads of the chips 36-1 to 36-$k$ of the sealed body 38, respectively to expose the pads.

Here, since the positions of the chips 16, 26, and 36 of the sealed bodies 18, 28, and 38 in the stacked body 7 are offset from each other, the via-holes 41, 42, and 43 can be collectively formed in the stacked body 7. Since the stacked body 7 is supported by the support 6 having high rigidity, the via-holes 41, 42, and 43 can be stably formed in the stacked body 7.

Figure 9C:
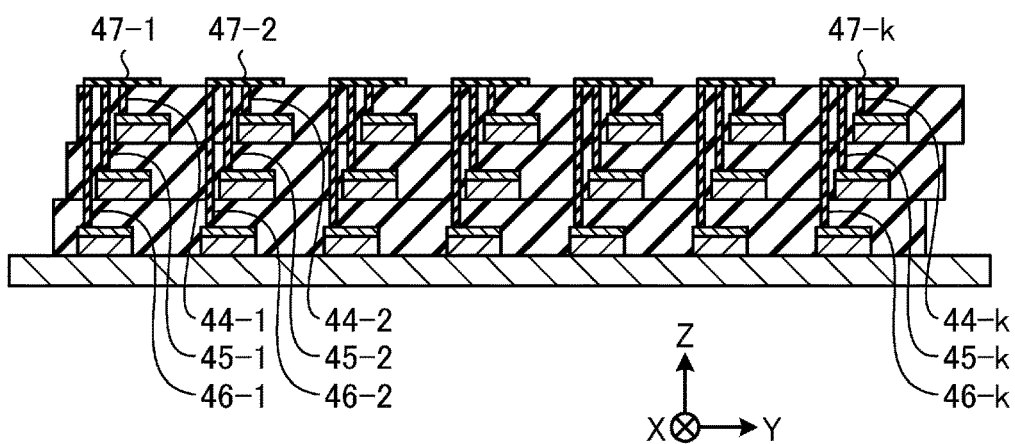

In the process of FIG. 9C, wiring structures such as via-plugs 44, 45, and 46 and electrode pads 47 are formed by sputtering, plating, and the like. That is, the conductive substances are collectively embedded in the via-holes 41, 42, and 43 to form the via-plugs 44, 45, and 46 collectively, and then the conductive film is deposited and patterned to form the electrode pads 47 electrically connected to the via-plugs 44, 45, and 46. For example, the electrode pad 47-1 is electrically connected to the pads of the chips 16-1, 26-1, and 36-1 via the via-plugs 44-1, 45-1, and 46-1. The electrode pad 47-2 is electrically connected to the pads of the chips 16-2, 26-2, and 36-2 via the via-plugs 44-2, 45-2, and 46-2. The electrode pad 47-$k$ is electrically connected to the pads of the chips 16-$k$, 26-$k$, and 36-$k$ via the via-plugs 44-$k$, 45-$k$, and 46-$k$.

In FIG. 9C, one electrode pad 47 is shown for each of the chips 16, 26, and 36 for simplification of illustration but the electrode pad 47 may be provided for each via-plug 44, 45, and 46.

Figure 10A:
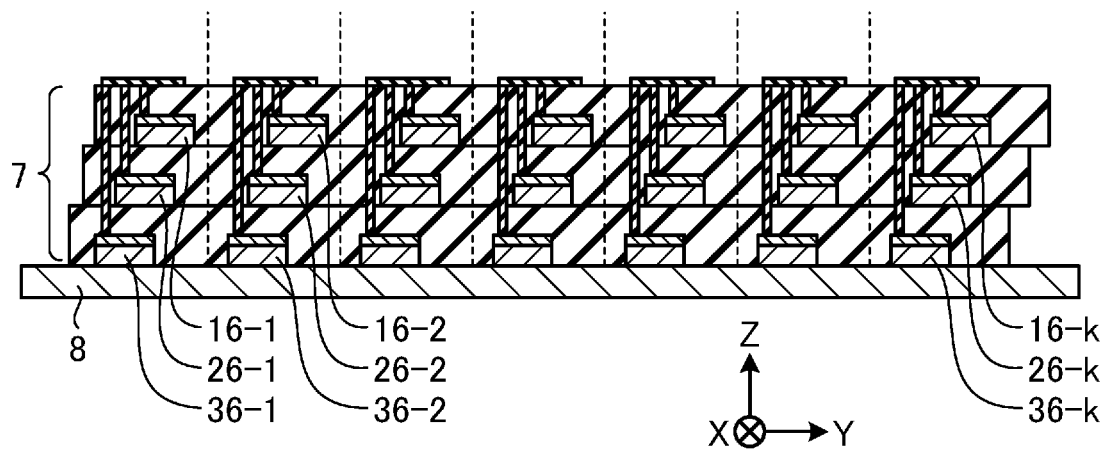
FIGS. 10A and 10B are cross-sectional views showing the method for manufacturing a semiconductor device.

In the process of FIG. 10A, the target position of the dicing process is determined as shown by the dotted line. As the target position of the dicing position, a position that can reach the support 8 without overlapping the chip group consisting of chips 16, 26, and 36 arranged in the Z direction is selected. The target position of the dicing process can be a grid-like line partitioning a matrix configuration of a plurality of chip groups each consisting of chips 16, 26, and 36 arranged in the Z direction (see FIG. 6).

Figure 10B:
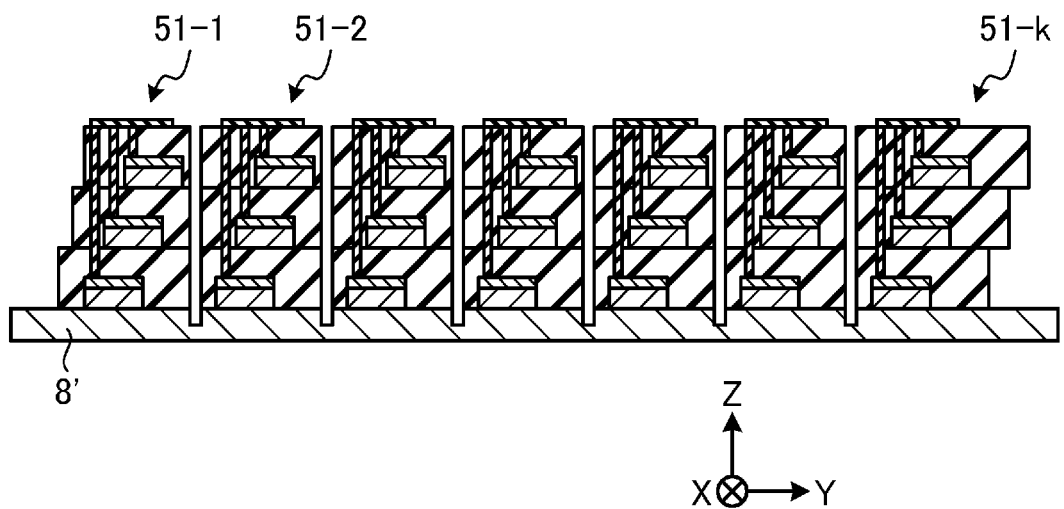

In the process of FIG. 10B, the dicing process is performed along the target position until a support 8' is reached. As a result, the stacked body 7 is divided into chip groups consisting of chips 16, 26, and 36 arranged in the Z direction and a plurality of mounting bodies 51-1, 51-2, . . . , 51-$k$ can be obtained.

After that, as shown in FIG. 11A, each mounting body 51 may be mounted in the form of an LGA package in which a wiring layer 48 and a land electrode 49 are formed on the electrode pad 47. As a result, the semiconductor device 1 is configured in the form of an LGA package. The land electrode 49 is electrically connected to the electrode pad 47 and the semiconductor device 1 is electrically accessible to the chips 16, 26, and 36 via the electrode pad 47 and the via-plugs 44, 45, and 46.

Alternatively, as shown in FIG. 11B, each mounting body 51 may be mounted in the form of a BGA package in which a wiring layer 52 and a ball electrode 53 are formed on the electrode pad 47. As a result, the semiconductor device 1 is configured in the form of a BGA package. The ball electrode 53 is electrically connected to the electrode pad 47 and the semiconductor device 1 is electrically accessible to the chips 16, 26, and 36 via the electrode pad 47 and the via-plugs 44, 45, and 46.

Alternatively, as shown in FIG. 11C, each mounting body 51 may be mounted on the front surface of an organic substrate 54 in which a ball electrode 59 is disposed on the back surface to form a wiring layer 55 and an electrode 56 on the electrode pad 47. The electrode 56 may be bonded to the organic substrate 54 with a wire 57, sealed with resin 58, and mounted in the form of a wire bonding package. As a result, the semiconductor device 1 may be configured in the form of a wire bonding package. The ball electrode 59 is electrically connected to the electrode pad 47 via the wire 57 and the electrode 56 and the semiconductor device 1 is electrically accessible to the chips 16, 26, and 36 via the electrode pad 47 and the via-plugs 44, 45, and 46.

Alternatively, although not shown, each mounting body 51 may be mounted in the form of a product device such as a USB memory or an SD card. As a result, the semiconductor device 1 is configured in the form of a product device.

As described above, in at least one embodiment, in the manufacture of the semiconductor device 1, the spacing between the plurality of chips is widened on the sheet, the plurality of chips are laminated with an insulating film to form a sealed body, and a plurality of such sealed bodies are stacked while being offset. As a result, when each chip is thin, the sealed body can be mounted stably at a low cost without handling the chip alone. That is, the throughput when manufacturing the semiconductor device 1 is improved while mounting the plurality of chips compactly.

Figure 12:
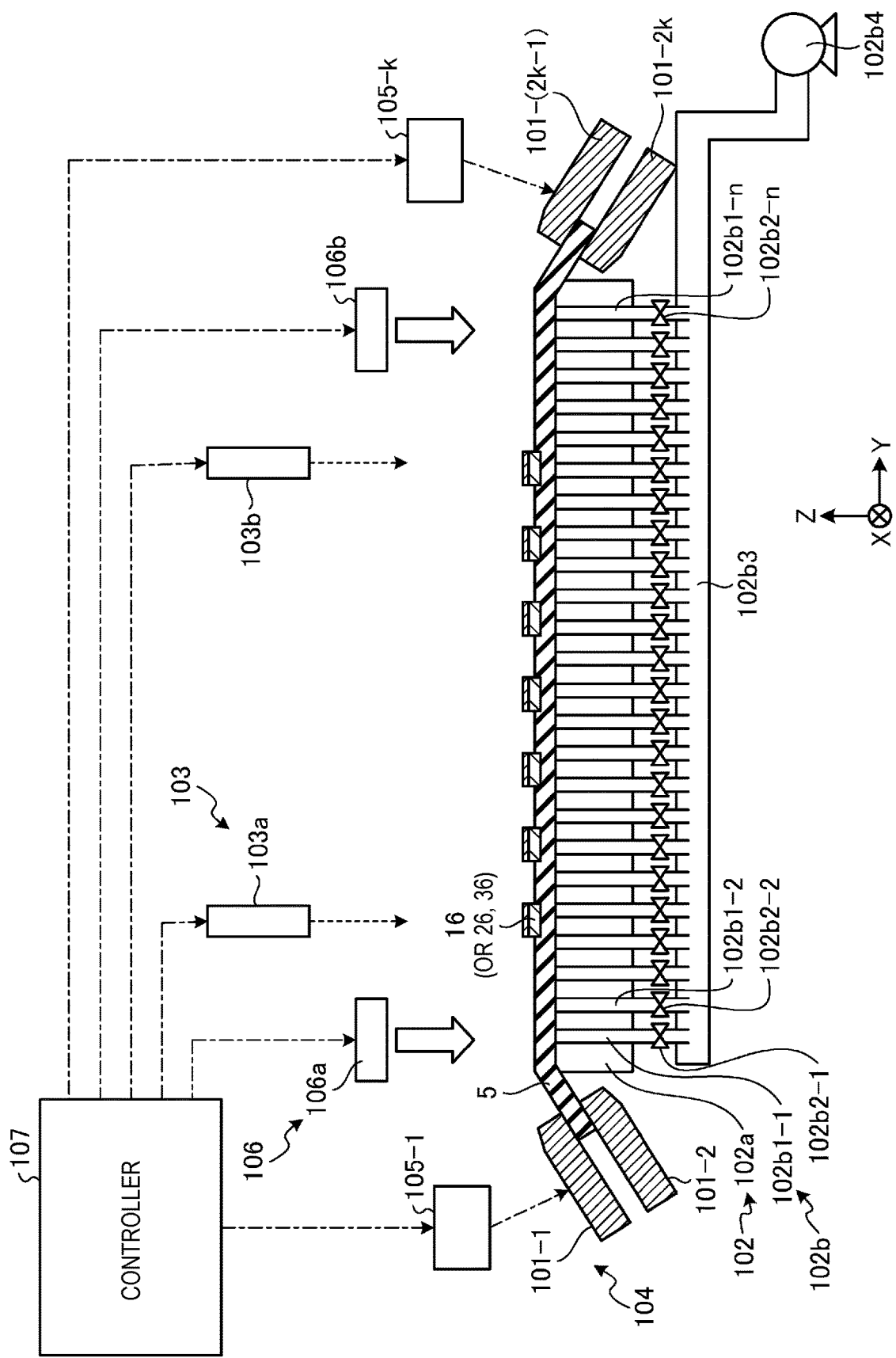
FIG. 12 is a cross-sectional view showing a configuration of a semiconductor manufacturing apparatus according to a first modification of at least one embodiment.
Figure 13:
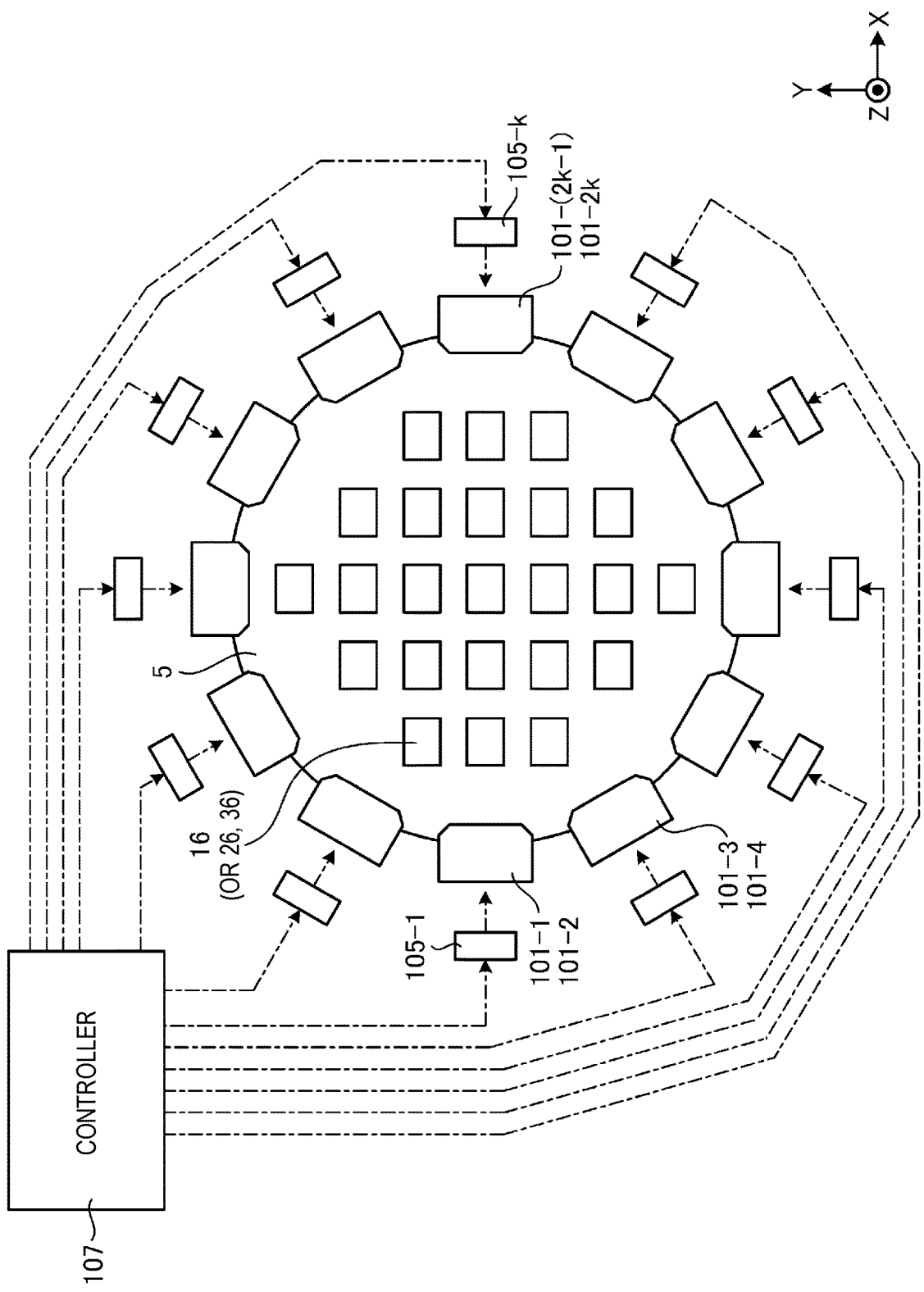
FIG. 13 is a plan view showing a configuration of the semiconductor manufacturing apparatus.

The expanding process shown in FIG. 2B may be performed by using a semiconductor manufacturing apparatus 100 as shown in FIGS. 12 and 13. FIG. 12 is a cross-sectional view showing a configuration of the semiconductor manufacturing apparatus 100 in a first modification of at least one embodiment. FIG. 13 is a plan view showing the configuration of the semiconductor manufacturing apparatus 100 in the first modification of at least one embodiment.

The semiconductor manufacturing apparatus 100 includes a stage 102, a measuring mechanism 103, an expanding mechanism 104 (expander), a handling mechanism 106 (handler), and a controller 107. The measurement mechanism 103 (position measurer) includes an imaging element 103a and an imaging element 103b. The expanding mechanism 104 includes a plurality of holding members 101-1 to 101-2k and a plurality of driving elements 105-1 to 105-k. k is an integer of 2 or more.

On the stage 102, the sheet 5 is placed on the main surface on the +Z side by the handling mechanism 106. The sheet 5 is a dicing tape or the like and has an adhesive formed on the surface 5a thereof. The sheet 5 is made of, for example, transparent resin having light transmittance. The semiconductor substrate 10 is attached to the surface 5a of the sheet 5 (see FIG. 1C), and the semiconductor substrate 10 is fragmented into k chips 16-1 to 16-k by the dicing process or the like. On the sheet 5, k chips 16-1 to 16-k are arranged in a matrix configuration in the XY directions.

The measuring mechanism 103 measures the position of each chip 16 on the sheet 5. The measurement mechanism 103 supplies the measurement result to the controller 107.

The expanding mechanism 104 expands the sheet 5 based on the measurement result of the measuring mechanism 103. The controller 107 controls the amount of expansion by the expanding mechanism 104 based on the deviation between the position of the chip 16 measured by the measuring mechanism 103 and the target position. The controller 107 determines the expanding amount of the sheet 5 to cancel the deviation and supplies the determined expanding amount to the expanding mechanism 104. The expanding mechanism 104 expands the sheet 5 to the outside according to the expanding amount received from the controller 107. As a result, the position of each of the chips 16 on the sheet 5 can be brought closer to the target position and the sheet 5 can be expanded with high accuracy.

The stage 102 includes a stage base 102a and a suction mechanism 102b. The suction mechanism 102b includes a plurality of suction holes 102b1-1 to 102b1-n, a plurality of on-off valves 102b2-1 to 102b2-n, an exhaust pipe 102b3, and a vacuum device 102b4. The stage base 102a is a flat plate-shaped member and the sheet 5 is placed on the upper surface thereof. n is an integer of 2 or more. The open ends of the plurality of suction holes 102b1-1 to 102b1-n are two-dimensionally arranged on the upper surface of the stage base 102a. Each of the suction holes 102b1-1 to 102b1-n extends in a direction substantially perpendicular to the upper surface of the stage base 102a and penetrates the stage base 102a to be able to communicate with the exhaust pipe 102b3. The exhaust pipe 102b3 communicates with the exhaust chamber of the vacuum device 102b4. Each of the suction holes 102b1-1 to 102b1-n can be evacuated by the vacuum device 102b4 via the exhaust pipe 102b3.

The plurality of on-off valves 102b2-1 to 102b2-n correspond to the plurality of suction holes 102b1-1 to 102b1-n. The on-off valves 102b2-1 to 102b2-n open and close the corresponding suction holes 102b1-1 to 102b1-n according to the control from the controller 107. Each of the suction holes 102b1-1 to 102b1-n locally adsorbs the sheet 5 when evacuated. The controller 107 can two-dimensionally control the suction state of the sheet 5 by opening and closing each of the suction holes 102b1-1 to 102b1-n in the suction mechanism 102b with the corresponding on-off valve 102b2.

The handling mechanism 106 includes arms 106a and 106b and can handle the sheet 5 using the arms 106a and 106b. The arms 106a and 106b adsorb the surface 5a of the sheet 5 and place the sheet 5 on the stage base 102a. The sheet 5 is adsorbed by the suction mechanism 102b into at least a part of the suction holes 102b1 of the plurality of suction holes 102b1-1 to 102b1-n on the stage base 102a. Here, the arms 106a and 106b cut out the sheet 5 into a substantially circular shape.

The expanding mechanism 104 includes a plurality of holding members 101-1 to 101-2k and a plurality of driving elements 105-1 to 105-k. The expanding mechanism 104 holds k locations on the sheet 5 by the plurality of holding members 101-1 to 101-2k. The plurality of locations are different from each other on the outer circumference of the sheet 5. The plurality of holding members 101-1 to 101-2k include k sets of two holding members 101 that hold the sheet 5 up and down. As shown in FIG. 13, the holding members 101-1 and 101-2 hold the sheet 5 up and down at a first position on the outer circumference of the substantially circular sheet 5. The holding members 101-3 and 101-4 hold the sheet 5 up and down at a second position on the outer circumference of the substantially circular sheet 5. The holding members 101-(2k-1) and 101-k hold the sheet 5 up and down at a k-th position on the outer circumference of the substantially circular sheet 5. The first position to the k-th position correspond to the k sets of the holding members 101. The k sets of holding members 101 correspond to the k driving elements 105. The expanding mechanism 104 can expand the sheet 5 two-dimensionally by driving each set of the holding members 101 in the first position to the k-th position by the corresponding driving element 105.

Figure 14A:
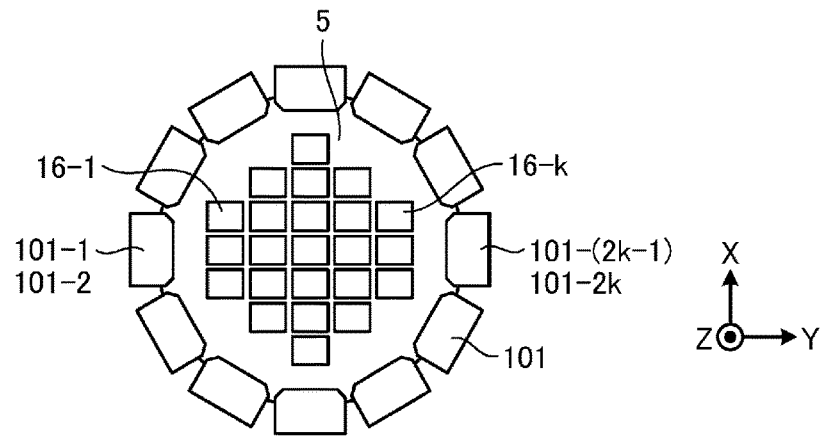
FIGS. 14A to 14C are plan views showing the operation of the semiconductor manufacturing apparatus.

For example, as shown in FIG. 14A, the semiconductor substrate 10 is fragmented into k chips 16-1 to 16-k by the dicing process or the like. On the sheet 5, k chips 16-1 to 16-k are arranged in a matrix configuration in the XY directions. Here, the measuring mechanism 103 measures the positions of the chips 16-1 to 16-k and supplies the measurement results to the controller 107. The controller 107 obtains a two-dimensional expanding amount to expand the sheet 5 according to the deviation between the position of each of the chips 16 measured by the measuring mechanism 103 and the target position. The controller 107 decomposes the obtained expanding amount into driving amounts of the plurality of driving elements 105-1 to 105-k. The controller 107 controls to independently drive the plurality of holding members 101-1 to 101-2k by the plurality of driving elements 105-1 to 105-k according to the decomposed driving amount of the plurality of driving elements 105-1 to 105-k.

Figure 14B:
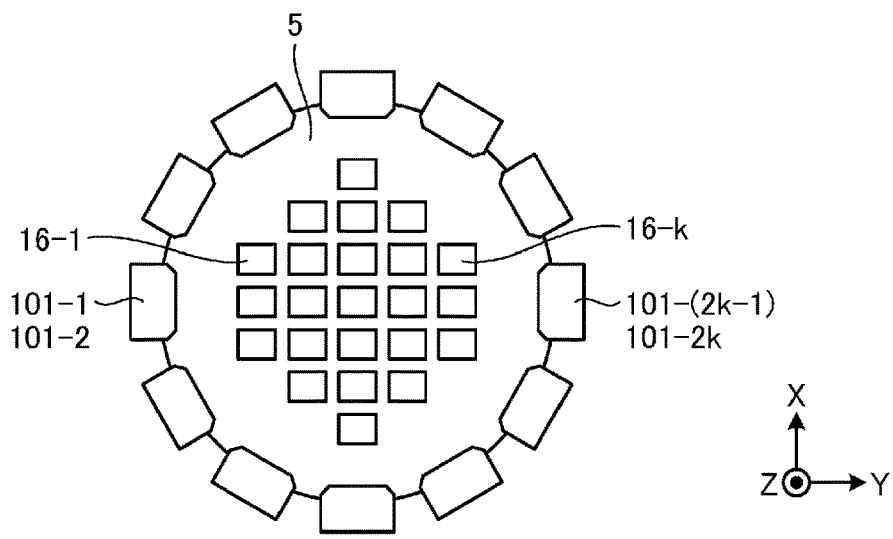

As a result, as shown in FIG. 14B, the sheet 5 is expanded outward in the XY directions and the spacing between the chips 16-1 to 16-k is widened. Here, the measuring mechanism 103 measures the positions of the chips 16-1 to 16-k and supplies the measurement results to the controller 107. The controller 107 obtains the deviation between the position of each of the chips 16 measured by the measuring mechanism 103 and the target position and determines whether the deviation is within the allowable range. When the deviation is not within the allowable range, the controller 107 obtains a two-dimensional expanding amount to expand the sheet 5. The controller 107 decomposes the obtained expanding amount into driving amounts of the plurality of driving elements 105-1 to 105-k. The controller 107 independently controls to drive the plurality of holding members 101-1 to 101-2k by the plurality of driving elements 105-1 to 105-k according to the decomposed driving amount of the plurality of driving elements 105-1 to 105-k.

Figure 14C:
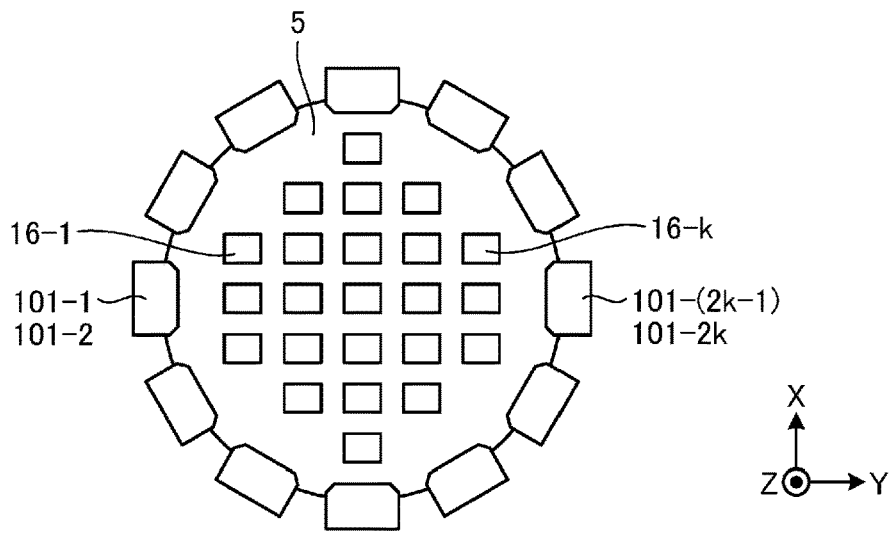

As a result, as shown in FIG. 14C, the sheet 5 is expanded outward in the XY directions and the spacing between the chips 16-1 to 16-k is further widened. Here, the measuring mechanism 103 measures the positions of the chips 16-1 to 16-k and supplies the measurement results to the controller 107. The controller 107 obtains the deviation between the position of each of the chips 16 measured by the measuring mechanism 103 and the target position and determines whether the deviation is within the allowable range. The controller 107 ends the expansion of the sheet 5 when the deviation is within the allowable range. As a result, the expanding mechanism 104 can expand the sheet 5 two-dimensionally while changing the expanding amount two-dimensionally.

As described above, in the semiconductor manufacturing apparatus 100, the controller 107 controls the expanding mechanism 104 to expand the sheet 5 according to the measurement result of the measuring mechanism 103. The controller 107 controls the amount of expansion by the expanding mechanism 104 based on the deviation between the position of the chip 16 measured by the measuring mechanism 103 and the target position. As a result, the position of each of the chips 16 on the sheet 5 can be brought closer to the target position and the sheet 5 can be expanded with high accuracy.

Next, a second modification of at least one embodiment will be described.

For example, the processes shown in FIGS. 15A to 16B may be performed after the process of FIG. 8B. FIGS. 15A to 16B are cross-sectional views showing a method for manufacturing a semiconductor device according to the second modification of at least one embodiment.

Figure 15A:
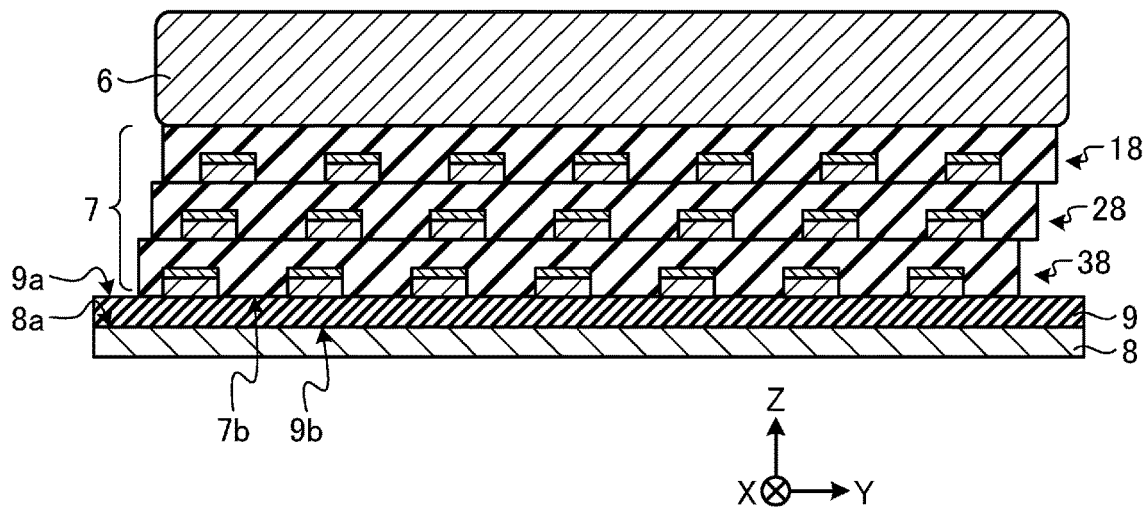
FIGS. 15A to 15C are cross-sectional views showing a method for manufacturing a semiconductor device according to a second modification of at least one embodiment.

In the process of FIG. 15A, an adhesive sheet 9 is attached to the back surface 7b of the stacked body 7, and the support 8 is attached to the back surface 9b of the adhesive sheet 9. The adhesive sheet 9 has an adhesive formed on the front surface 9a thereof. The adhesive sheet 9 can be formed of a substance having light transmittance (for example, resin). The adhesive sheet 9 and the support 8 each have a shape corresponding to the stacked body 7 and have, for example, a disk shape flat in the XY direction. The rigidity of the adhesive sheet 9 may be smaller than that of the support 8.

Figure 15B:
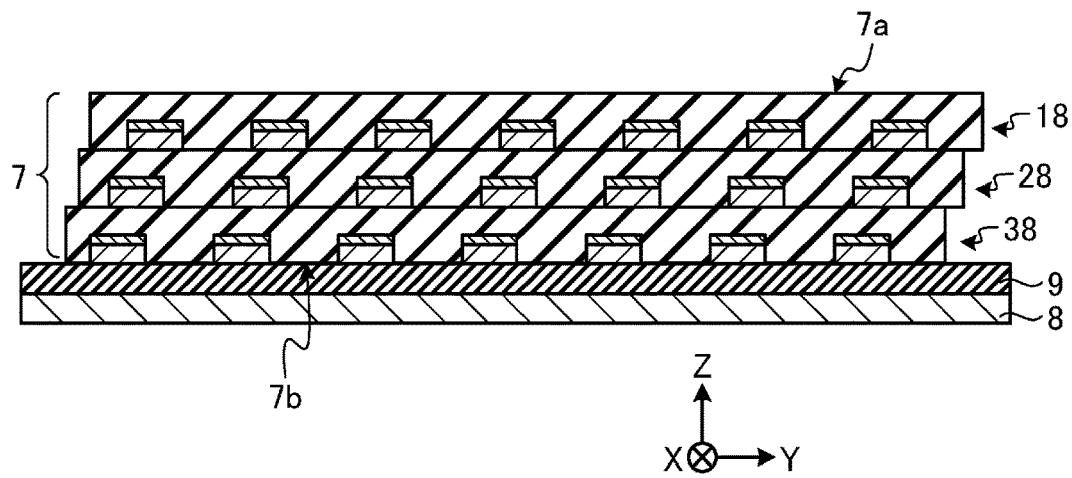

In the process of FIG. 15B, the stacked body 7 is transferred from the support 6 to the adhesive sheet 9 and the support 8. In the stacked body 7, the support 6 is peeled off from the front surface 7a to expose the front surface 7a while maintaining the state in which the back surface 7b is supported by the support 8 via the adhesive sheet 9. As a result, the stacked body 7 can be obtained in which the back surface 7b is supported by the adhesive sheet 9 and the support 8 and the front surface 7a is exposed.

Figure 15C:
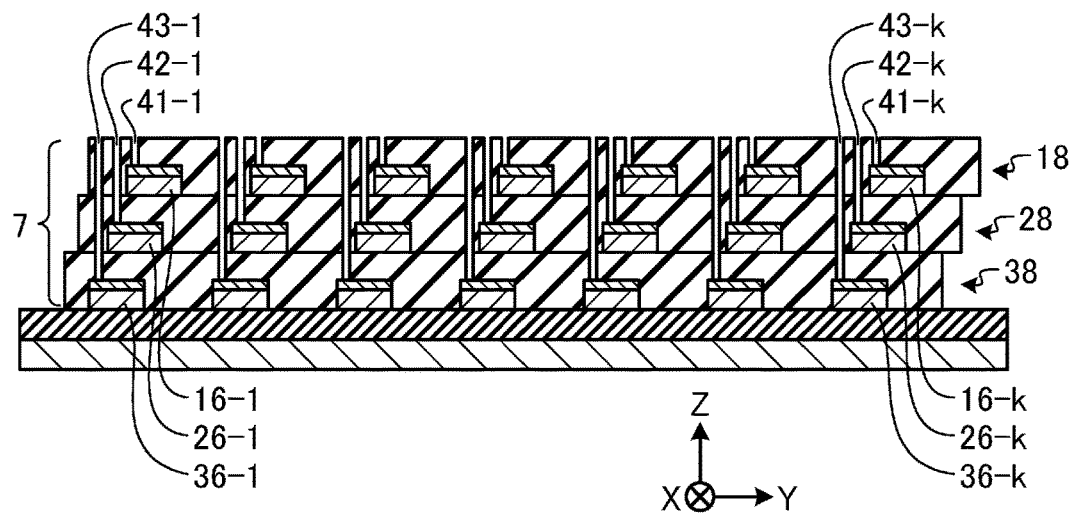

In the process of FIG. 15C, the via-holes 41, 42, and 43 are formed in the stacked body 7 by the laser process or the like. Here, since the positions of the chips 16, 26, and 36 of the sealed bodies 18, 28, and 38 in the stacked body 7 are offset from each other, the via-holes 41, 42, and 43 can be collectively formed in the stacked body 7. Since the stacked body 7 is supported by the support 6 having high rigidity via the adhesive sheet 9, the via-holes 41, 42, and 43 can be stably formed in the stacked body 7. If the rigidity of the support 6 is large, the stacked body 7 can be stably supported even if the rigidity of the adhesive sheet 9 is small.

Figure 16A:
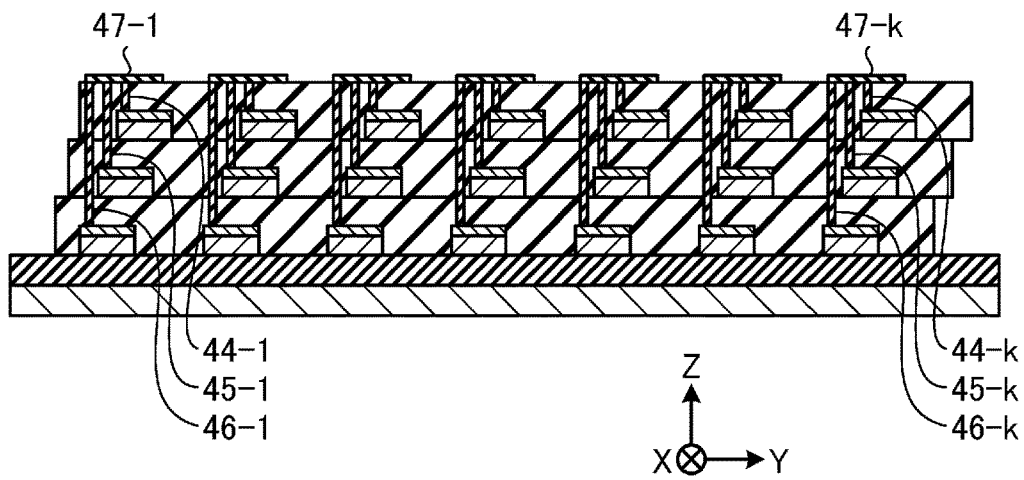
FIGS. 16A to 16C are cross-sectional views showing the method for manufacturing a semiconductor device.

In the process of FIG. 16A, wiring structures such as the via-plugs 44, 45, and 46 and the electrode pads 47 are formed by sputtering, plating, and the like.

Figure 16B:
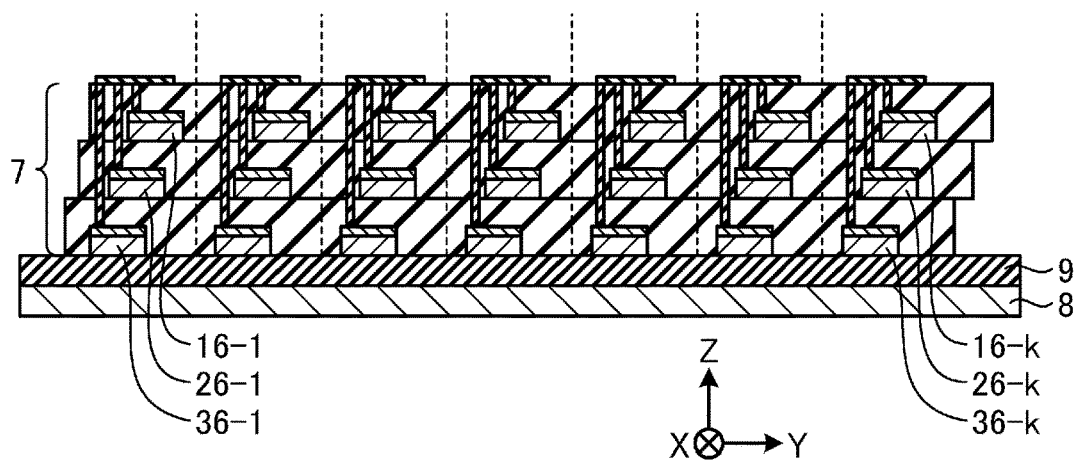

In the process of FIG. 16B, the target position of the dicing process is determined as shown by the dotted line.

Figure 16C:
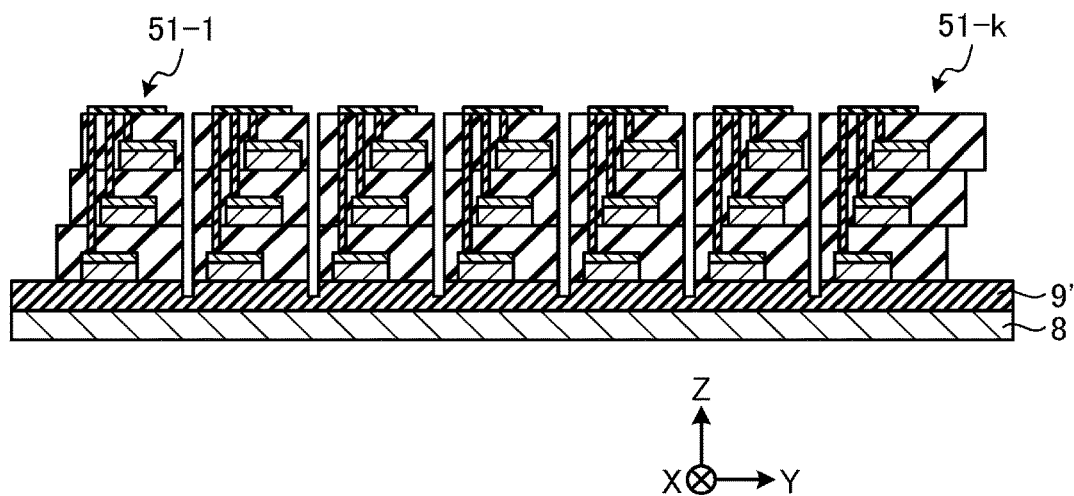

In the process of FIG. 16C, the dicing process is performed along the target position until an adhesive sheet 9' is reached. As a result, the stacked body 7 is divided into chip groups consisting of chips 16, 26, and 36 arranged in the Z direction and the plurality of mounting bodies 51-1, 51-2, . . . , 51-k can be obtained.

Here, the groove of the dicing process does not reach the support 8. As a result, the support 8 can be reused when the next semiconductor device is manufactured.

Next, a third modification of at least one embodiment will be described.

For example, the processes shown in FIGS. 17A to 21B may be performed after the process of FIG. 1B. FIGS. 17A to 21B are cross-sectional views showing a method for manufacturing a semiconductor device according to the third modification of at least one embodiment.

Figure 17A:
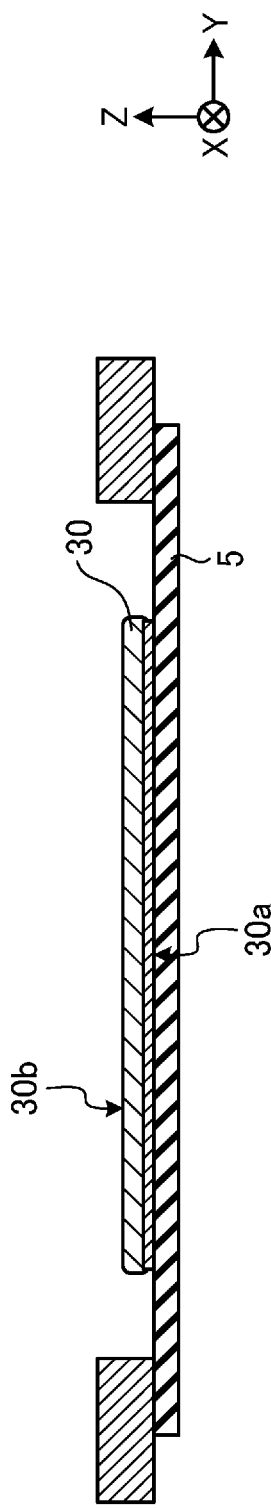
FIGS. 17A to 17C are cross-sectional views showing a method for manufacturing a semiconductor device according to a third modification of at least one embodiment.

In the process of FIG. 17A, a semiconductor substrate 30 is transferred from a sheet 3 to the sheet 5. A front surface 30a of the semiconductor substrate 30 is attached to the sheet 5. Here, the semiconductor substrate 30 is attached to the sheet 5 with the back surface 30b exposed (face-down state).

Figure 17B:
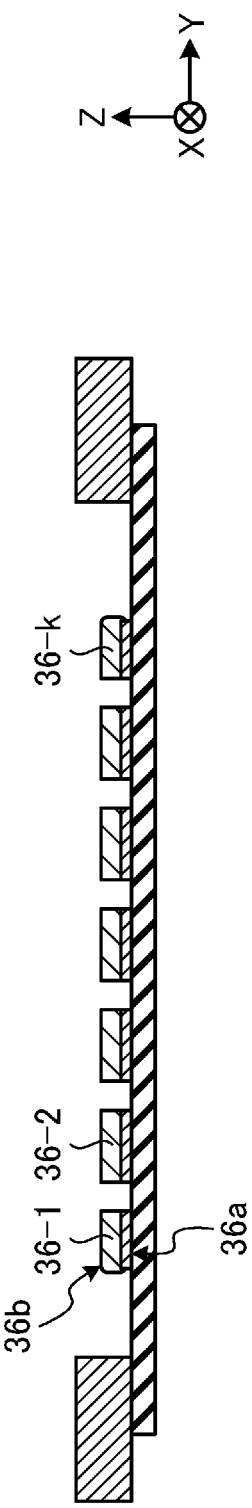

In the process of FIG. 17B, the semiconductor substrate 30 is fragmented into k chips 36-1 to 36-k. The front surface 36a of each of the chips 36-1 to 36-k is attached to the sheet 5 with the back surface 36b exposed (face-down state).

Figure 17C:
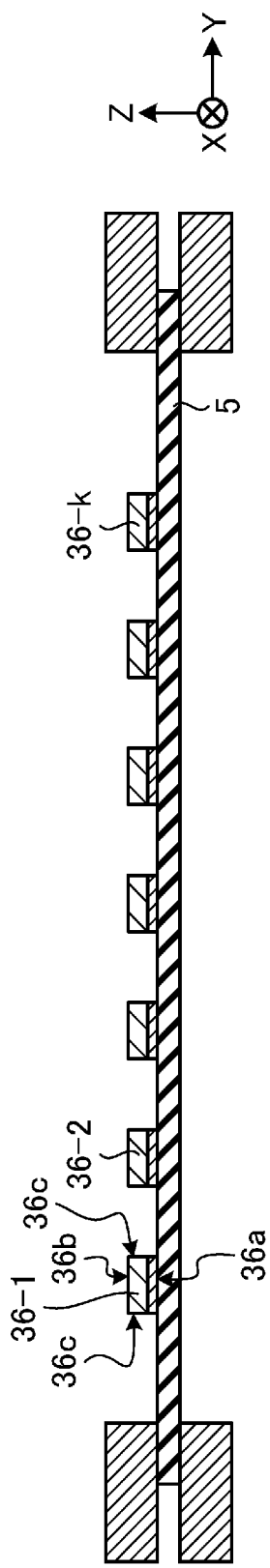

In the process of FIG. 17C, the sheet 5 is expanded to widen the spacing between the plurality of chips 36-1 to 36-k on the sheet 5. The front surface 36a of each of the chips 36-1 to 36-k is attached to the sheet 5 with the back surface 36b exposed.

Figure 18A:
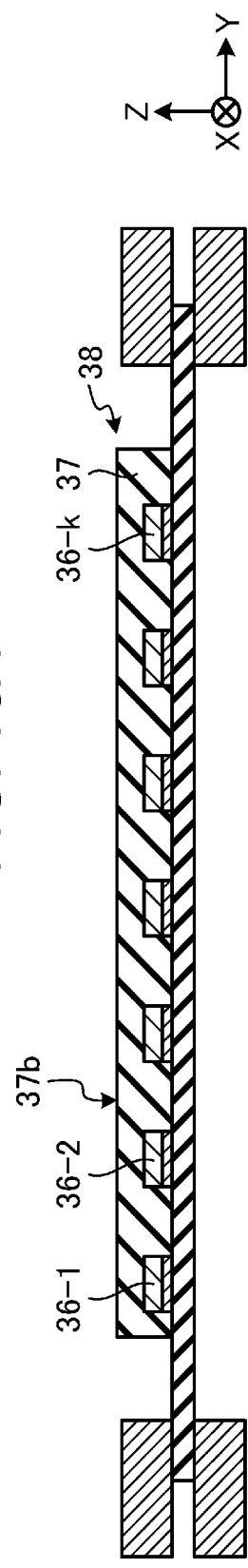
FIGS. 18A to 18C are cross-sectional views showing the method for manufacturing a semiconductor device.

In the process of FIG. 18A, the back surface 36b and the side surface 36c (see FIG. 17C) of each of the plurality of chips 36-1 to 36-k are covered with an insulating film 37 to form the third-stage sealed body 38.

Figure 18B:
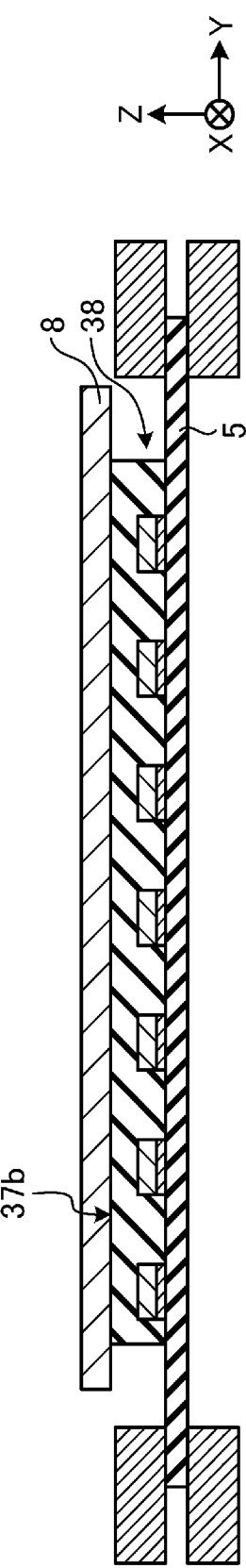

In the process of FIG. 18B, the support 8 is attached to the back surface 37b of the sealed body 38 instead of the support 6 (see FIG. 4A). The support 8 may be the same as the support 8 attached to the back surface 7b of the stacked body 7 in the process of FIG. 8C in at least one embodiment.

Figure 18C:
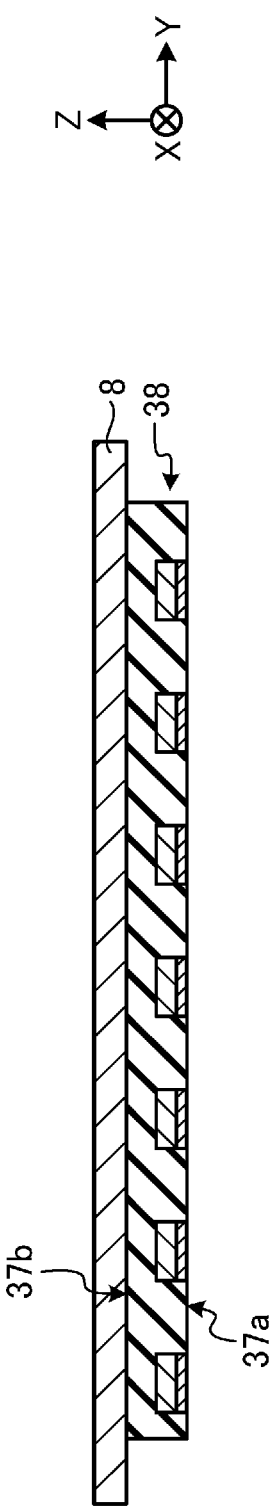

In the process of FIG. 18C, the sealed body 38 is transferred from the sheet 5 to the support 8. As a result, the third-stage sealed body 38 can be obtained in which the back surface 37b is supported by the support body 8 and the front surface 37a is exposed.

In the process of FIG. 19A, the second-stage sealed body 28 is prepared. The second-stage sealed body 28 is prepared in the same manner as in FIGS. 17A to 18C. The third-stage sealed body 38 is disposed on the +Z side of the second-stage sealed body 28 by grasping and moving the support 6. Alternatively, the second-stage sealed body 28 is disposed on the −Z side of the third-stage sealed body 38 by moving the sheet 5 with the holding member 101, or the like.

In the process of FIG. 19B, the Y position of each of the chips 36-1 to 36-k in the third-stage sealed body 38 is offset by the offset amount D with respect to the Y position of each of the chips 26-1 to 26-k in the second-stage sealed body 28.

In the process of FIG. 19C, the third-stage sealed body 38 is stacked on the second-stage sealed body 28. As a result, a stacked body 7" is formed in which the chip positions of the plurality of sealed bodies 38 and 28 are offset from each other in the plane direction.

In the process of FIG. 20A, the stacked body 7" is transferred from the sheet 5 to the support 8. As a result, the stacked body 7" can be obtained in which the back surface 7b" is supported by the support 6 and the front surface 7a" is exposed.

In the process of FIG. 20B, the first-stage sealed body 18 is prepared. The first-stage sealed body 18 is prepared in the same manner as in FIGS. 17A to 18C. The stacked body 7" is disposed on the +Z side of the first-stage sealed body 18 by grasping and moving the support 6. Alternatively, the stacked body 7" is disposed on the −Z side of the first-stage sealed body 18 by moving the sheet 5 with the holding member 101.

In the process of FIG. 20C, the Y position of each of the chips 16-1 to 16-k in the first-stage sealed body 18 is offset by the offset amount D with respect to the Y position of each of the chips 26-1 to 26-k in the second-stage sealed body 28.

Figure 21A:
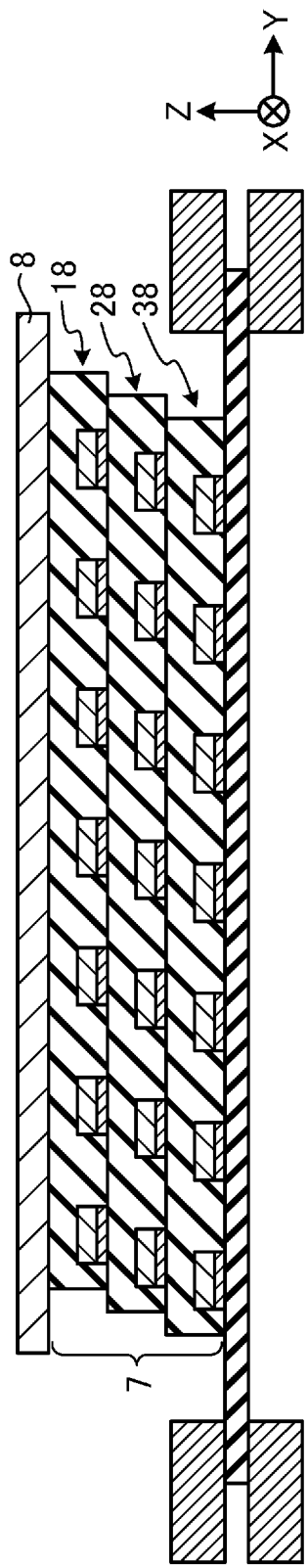
FIGS. 21A and 21B are cross-sectional views showing the method for manufacturing a semiconductor device.

In the process of FIG. 21A, the stacked body 7" is stacked on the +Z side of the first-stage sealed body 18. As a result, the stacked body 7 is formed while the chip positions of the plurality of sealed bodies 18, 28, and 38 are offset from each other in the XY plane direction.

Figure 21B:
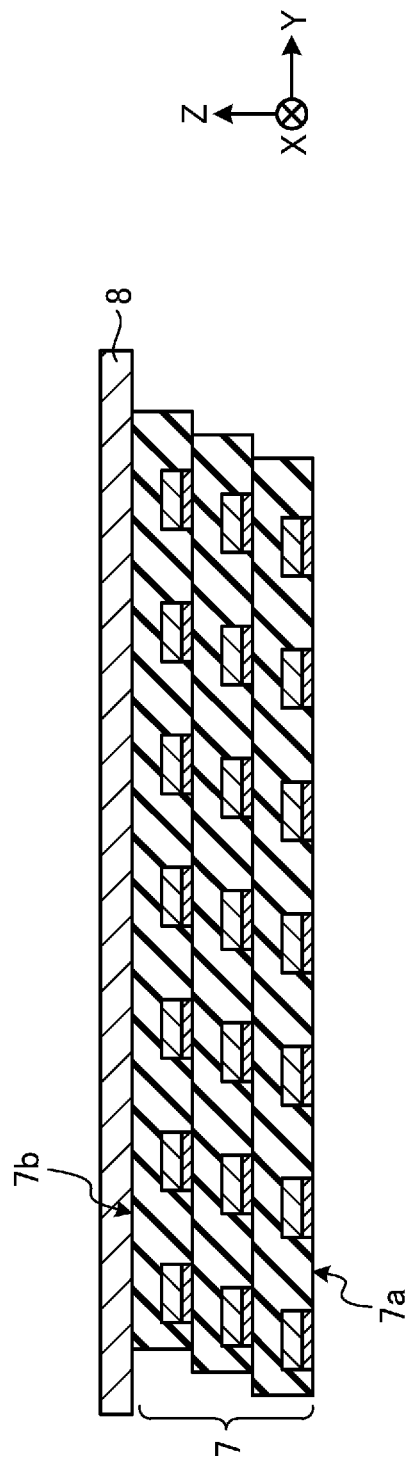

In the process of FIG. 21B, the stacked body 7 is transferred from the sheet 5 to the support 8. As a result, the stacked body 7 can be obtained in which the back surface 7b is supported by the support 8 and the front surface 7a is exposed. After that, the same process as in FIG. 9B and subsequent processes are performed.

As such, since the sealed body is formed with each of the chips in the face-down state, the semiconductor device 1 (see FIGS. 11A to 11C) can be manufactured without using the support 6 in the middle. Therefore, the manufacturing process of the semiconductor device 1 can be simplified and the manufacturing cost of the semiconductor device 1 can be reduced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device comprising:
   attaching a substrate to a sheet;
   dividing the substrate into a first plurality of individual chips;
   expanding the sheet to increase spacing between the first plurality of individual chips;
   covering a main surface and a side surface of each of the first plurality of individual chips with a first insulating film to form a first sealed body;
   covering a main surface and a side surface of each of a second plurality of chips with a second insulating film to form a second sealed body; and
   forming a stacked body from the first and second sealed bodies,
   wherein
      in the stacked body, the second sealed body is positioned on the first sealed body such that the second plurality of chips of the second sealed body are offset in a first direction with respect to the first plurality of individual chips of the first sealed body.

2. The method for manufacturing a semiconductor device according to claim 1, wherein
   an amount of the offset in the first direction is smaller than a spacing between the first plurality of individual chips in the first sealed body and larger than a dimension of a pad on a respective one of the first plurality of individual chips.

3. The method for manufacturing a semiconductor device according to claim 2, wherein there is no offset in a third direction perpendicular to the first direction and in a plane of the semiconductor device.

4. The method for manufacturing a semiconductor device according to claim 1, wherein
   increasing the spacing between the first plurality of individual chips includes expanding the sheet according to a result of measuring spacing between the first plurality of individual chips to widen the spacing between the first plurality of individual chips to a predetermined target spacing.

5. The method for manufacturing a semiconductor device according to claim 1, further comprising:
   transferring the second sealed body from the sheet to a first support,
   wherein the forming the stacked body includes stacking the second sealed body transferred to the first support on the first sealed body;
   transferring the stacked body from the first support to a second support having a higher rigidity than the first support; and
   forming a wiring structure electrically connected to the chips in the first and second sealed bodies in a state where the stacked body is supported by the second support.

6. The method for manufacturing a semiconductor device according to claim 1,
   wherein the forming the first sealed body includes covering a back surface and the side surface of each of the first plurality of individual chips with resin and sealing the first plurality of individual chips, and
   the method further comprising:
   transferring the first sealed body from the sheet to a first support; and
   wherein forming the stacked body includes forming the stacked body in a state where the transferred first sealed body is supported by the first support; and
   forming a wiring structure electrically connected to the chips in the first and second sealed bodies in a state where the stacked body is supported by the first support.

7. The method for manufacturing a semiconductor device according to claim 1, wherein
   in the stacked body, the first plurality of individual chips in the first sealed body and the second plurality of chips in the second sealed body are electrically insulated from each other.

8. The method for manufacturing a semiconductor device according to claim 1, wherein the sheet is a transparent resin.

9. The method for manufacturing a semiconductor device according to claim 1, wherein the dividing includes dicing the substrate.

10. The method for manufacturing a semiconductor device according to claim 1, wherein the first plurality of individual chips includes semiconductor chips.

11. The method for manufacturing a semiconductor device according to claim 1, wherein the first insulating film includes a transparent resin.

12. The method for manufacturing a semiconductor device according to claim 1, wherein the first sealed body is disk shaped.

13. The method for manufacturing a semiconductor device according to claim 1, wherein the covering the main surface and the side surface of each of the first plurality of individual chips includes applying a stress in a second direction perpendicular to a plane of the semiconductor device.

14. The method for manufacturing a semiconductor device according to claim 1, further comprising forming via holes extending through the stacked body to the first plurality of individual chips.

* * * * *